(12) United States Patent
Werner et al.

(10) Patent No.: US 8,913,400 B2
(45) Date of Patent: Dec. 16, 2014

(54) SYSTEMS AND METHODS FOR SHIELDING CIRCUITRY FROM INTERFERENCE WITH A SHIELD ASSEMBLY HAVING A REMOVABLE TAB

(75) Inventors: Christopher M. Werner, San Jose, CA (US); Jared Mitchell Kole, San Jose, CA (US)

(73) Assignee: Apple Inc., Cupertino, CA (US)

( * ) Notice: Subject to any disclaimer, the term of this patent is extended or adjusted under 35 U.S.C. 154(b) by 283 days.

(21) Appl. No.: 13/608,884

(22) Filed: Sep. 10, 2012

(65) Prior Publication Data
US 2014/0071635 A1 Mar. 13, 2014

(51) Int. Cl.
*H05K 7/14* (2006.01)
(52) U.S. Cl.
USPC ........................................................ 361/800
(58) Field of Classification Search
USPC ........................................................ 361/800
See application file for complete search history.

(56) References Cited

U.S. PATENT DOCUMENTS

| | | | | |
|---|---|---|---|---|
| 4,658,334 A | * | 4/1987 | McSparran et al. | 361/800 |
| 6,269,008 B1 | * | 7/2001 | Hsu | 361/816 |
| 6,903,262 B2 | * | 6/2005 | Blersch | 174/385 |
| 8,462,521 B2 | * | 6/2013 | Lin | 361/818 |
| 8,570,735 B2 | * | 10/2013 | Tang et al. | 361/679.54 |
| 8,570,766 B2 | * | 10/2013 | Noguchi et al. | 361/816 |
| 2001/0002877 A1 | * | 6/2001 | Alina et al. | 361/800 |
| 2004/0012939 A1 | * | 1/2004 | Ta et al. | 361/800 |
| 2005/0254224 A1 | * | 11/2005 | Fagrenius et al. | 361/800 |
| 2009/0207579 A1 | * | 8/2009 | Boetto et al. | 361/818 |

* cited by examiner

*Primary Examiner* — Forrest M Phillips

(57) ABSTRACT

This is directed to systems and methods for shielding circuitry from interference with a shield assembly. In some embodiments, a shield assembly may include a shield fence having a fence body, at least one fence finger extending from the bottom of the fence body for coupling to a circuit board, and a tab extending from the fence body. The tab is configured to be removed from the shield fence after the shield fence is coupled to the circuit board.

25 Claims, 16 Drawing Sheets

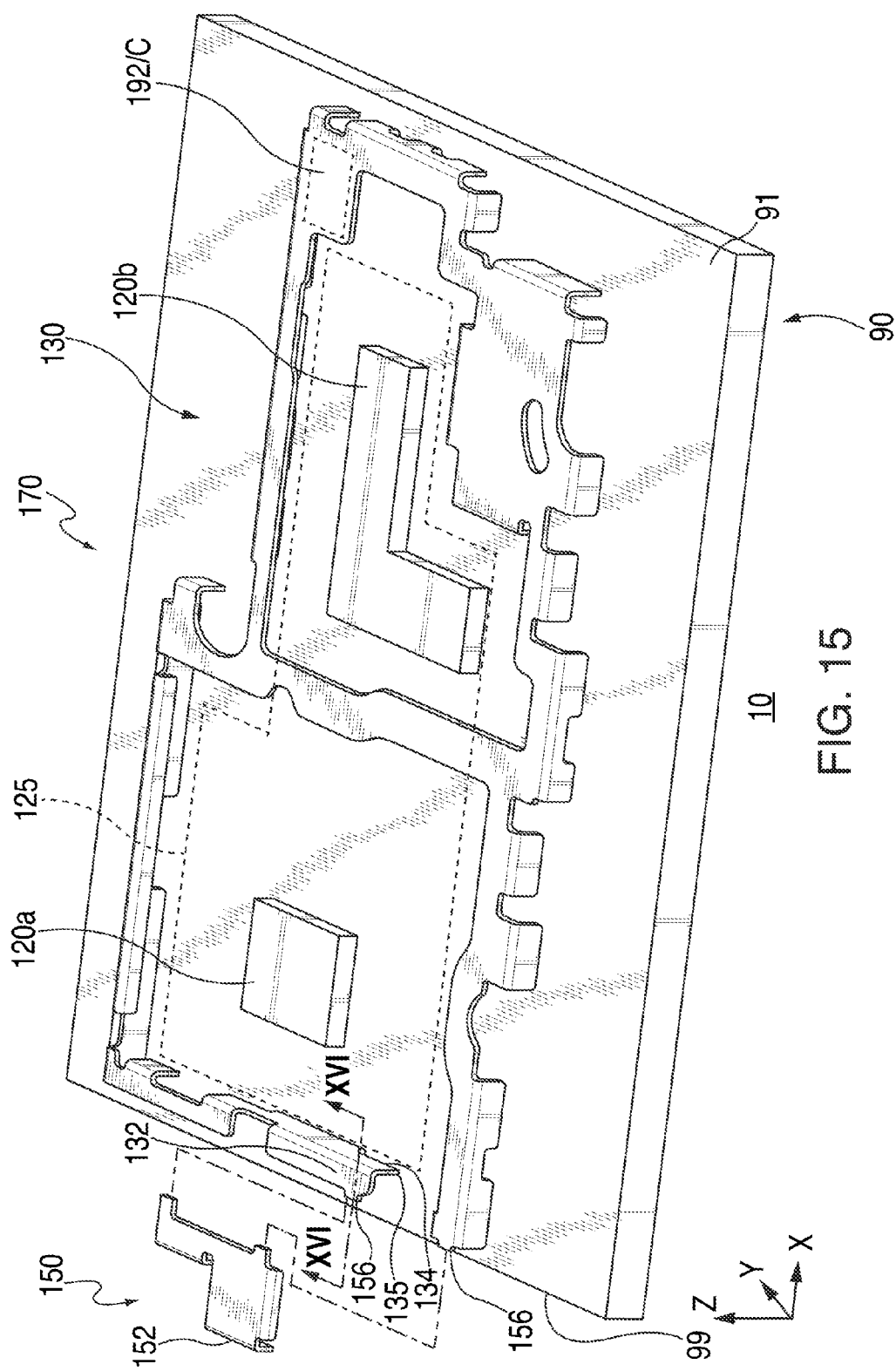

SYSTEMS AND METHODS FOR SHIELDING CIRCUITRY FROM INTERFERENCE WITH A SHIELD ASSEMBLY HAVING A REMOVABLE TAB

FIELD OF THE INVENTION

This can relate to systems and methods for shielding circuitry from interference and, more particularly, to systems and methods for shielding circuitry from interference with a shield assembly having a removable tab.

BACKGROUND OF THE DISCLOSURE

Electromagnetic interference ("EMI") and radio frequency interference ("RFI") are two of the various types of unwanted disturbances that may interrupt, obstruct, or otherwise affect or limit the effective performance of electronic circuitry due to electromagnetic conduction or electromagnetic radiation from an external source. One way to reduce such interference for electronic circuitry is to place electrically conducting metal around the circuitry. For example, an electronic circuit component on a circuit board is sometimes placed under a metal cover or can. A possible problem with the foregoing approach is that the metal shielding is typically soldered or otherwise fixed to the circuit board about the circuit component, such that, once the shielding is mounted to the circuit board, the circuit component cannot be physically accessed without removing the shielding from the circuit board.

SUMMARY OF THE DISCLOSURE

Systems and methods for shielding circuitry from interference with a shield assembly having a removable tab are provided.

According to some embodiments, there may be provided a shield assembly that may include a shield fence having a fence body and a number of fence fingers extending from the bottom of the fence body for coupling to a circuit board. The shield assembly may also include a tab extending from the shield fence, and a shield lid for coupling to the top of the fence body. The tab may be configured to be removed from the shield fence after the shield fence is coupled to the circuit board.

According to some other embodiments, there may be provided an electronic device that may include a circuit board having a top surface, a bottom surface, and a side surface that extends from the top surface to the bottom surface. The electronic device may also include a shield assembly for coupling to the top surface of the circuit board. The electronic device may also include a tab extending from the shield assembly. The tab may be configured to be removed from the shield assembly after the shield assembly is coupled to the top surface of the circuit board.

According to yet some other embodiments, there may be provided a method that may include coupling a shield fence to a top surface of a circuit board, and removing a tab from the shield fence after the coupling.

BRIEF DESCRIPTION OF THE DRAWINGS

The above and other aspects of the invention, its nature, and various features will become more apparent upon consideration of the following detailed description, taken in conjunction with the accompanying drawings, in which like reference characters refer to like parts throughout, and in which:

FIG. 15 is an isometric view, similar to FIG. 13, of the shield fence and the surface of FIGS. 13 and 14, in a second state of assemblage, in accordance with some embodiments of the invention;

DETAILED DESCRIPTION OF THE DISCLOSURE

Figure 1:
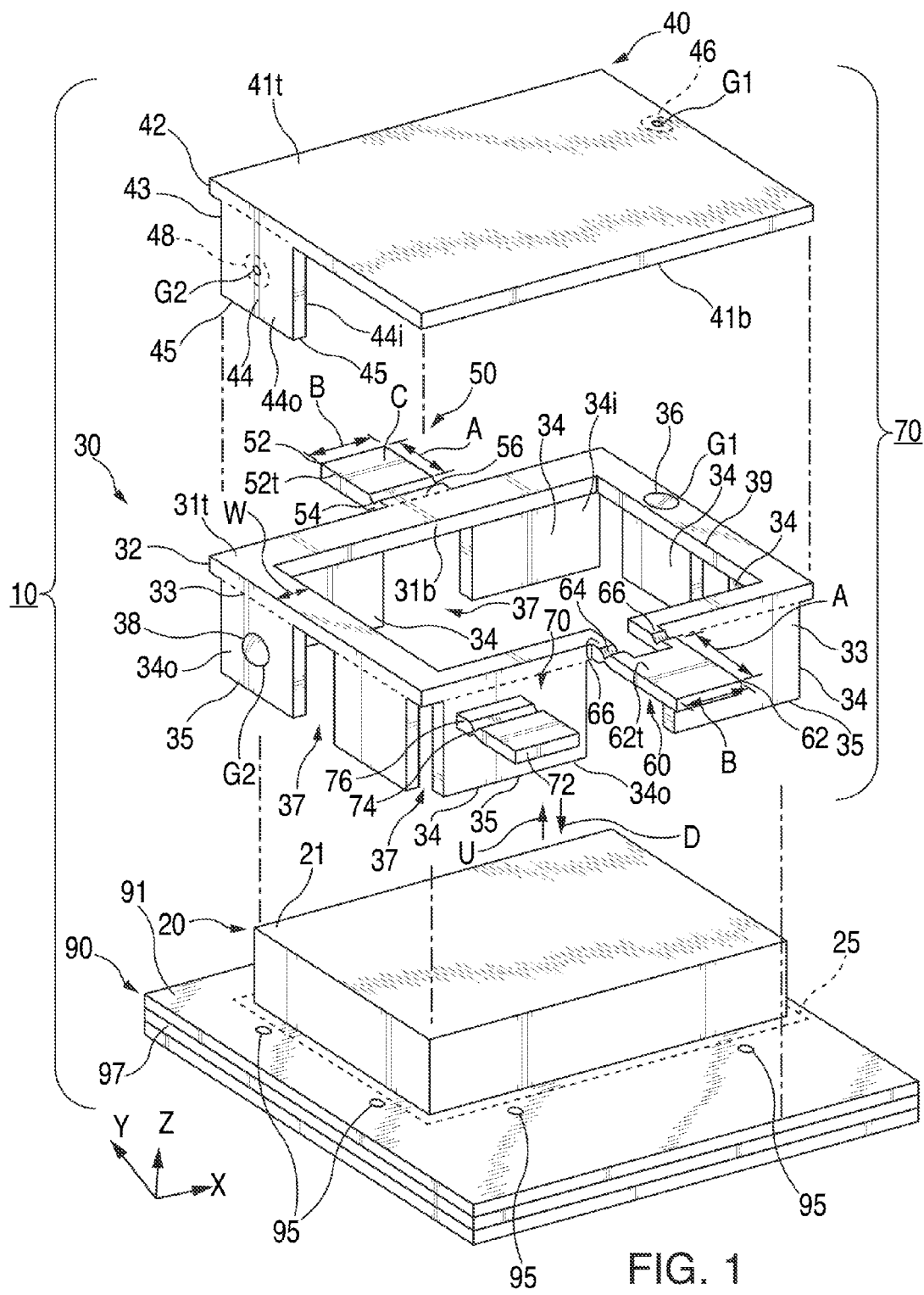
FIG. 1 is an isometric view of a portion of an electronic device and a shield assembly, in a first stage of assemblage, in accordance with some embodiments of the invention.

Systems and methods for shielding circuitry from interference with a shield assembly having a removable tab are provided and described with reference to FIGS. 1-17.

FIGS. 1-9, for example, show various portions of an exemplary electronic device 10 that may include an electronic component 20. Electronic component 20 may be coupled to a circuit board 90 and may be shielded by a shield assembly 70.

The term "electronic device" can include, but is not limited to, music players, video players, still image players, game players, other media players, music recorders, video recorders, cameras, other media recorders, radios, medical equipment, domestic appliances, transportation vehicle instruments, musical instruments, calculators, cellular telephones, other wireless communication devices, personal digital assistants, remote controls, pagers, computers (e.g., desktops, laptops, tablets, servers, etc.), monitors, televisions, stereo equipment, set up boxes, set-top boxes, boom boxes, modems, routers, keyboards, mice, speakers, printers, and combinations thereof.

As shown in FIGS. 1-9, for example, electronic device 10 may include circuit board 90 and electronic component 20. Circuit board 90 may be a central or primary printed circuit board ("PCB") of electronic device 10, and may also be known as a main circuit board, motherboard, mainboard, baseboard, system board, planar board, or logic board. Circuit board 90 may provide one or more attachment points to electronic component 20 of electronic device 10. Although FIGS. 1-9 only show one electronic component (i.e., component 20) coupled to circuit board 90, in other embodiments, two or more electronic components may be provided on circuit board 90 of electronic device 10. Generally, most of the basic circuitry and components required for electronic device 10 to function may be onboard or coupled (e.g., via one or more cables, bond pads, leads, terminals, cables, wires, contact regions, etc.) to circuit board 90. For example, electronic component 20 may be mounted or otherwise coupled to a top surface 91 of circuit board 90. Electronic component 20 may include one or more chipsets or specialized groups of integrated circuits. For example, circuit board 90 may include two components or chips, such as a Northbridge and Southbridge. Although in other embodiments, these chips may be combined into a single component. Electronic component 20 can also be one of various other types of component, including, but not limited to, a processor, memory, power supply, communications circuitry, input component, output component, and combinations thereof.

As shown in FIGS. 1-9, for example, electronic component 20 may include a top surface 21, a bottom surface 29, and at least one terminal or bond pad or other component contact region 23 coupled to circuitry (not shown) of electronic component 20. Each component contact region 23 of electronic component 20 may also be electrically coupled to a respective terminal, bond pad, or other type of board contact region 93 of circuit board 90. Each board contact region 93 of circuit board 90 may also be coupled to one or more signal planes, vias, or other circuitry (not shown) of circuit board 90. For example, as shown in FIGS. 3, 4, 6, 7, and 9, electronic component 20 may include component contact region 23 at, on, or coupled to bottom surface 29. Component contact region 23 may be coupled to a respective board contact region 93 of circuit board 90, which may be at, on, or coupled to top surface 91 of circuit board 90, for example. Component contact region 23 and board contact region 93 may be directly coupled to one another.

Figure 4:
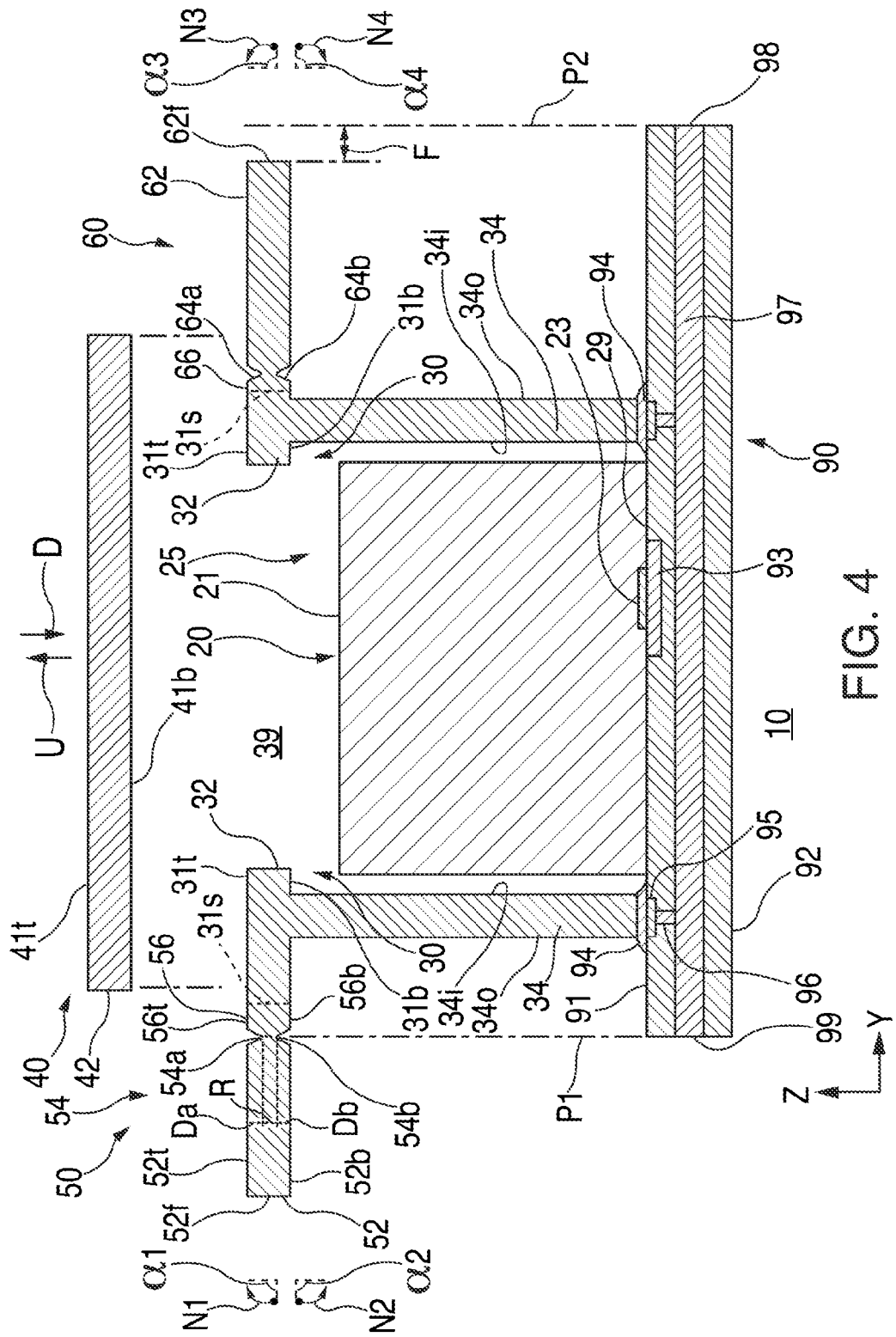
FIG. 4 is a partial cross-sectional view of the portion of the electronic device and the shield assembly of FIGS. 1-3, taken from line IV-IV of FIG. 2.
Figure 7:
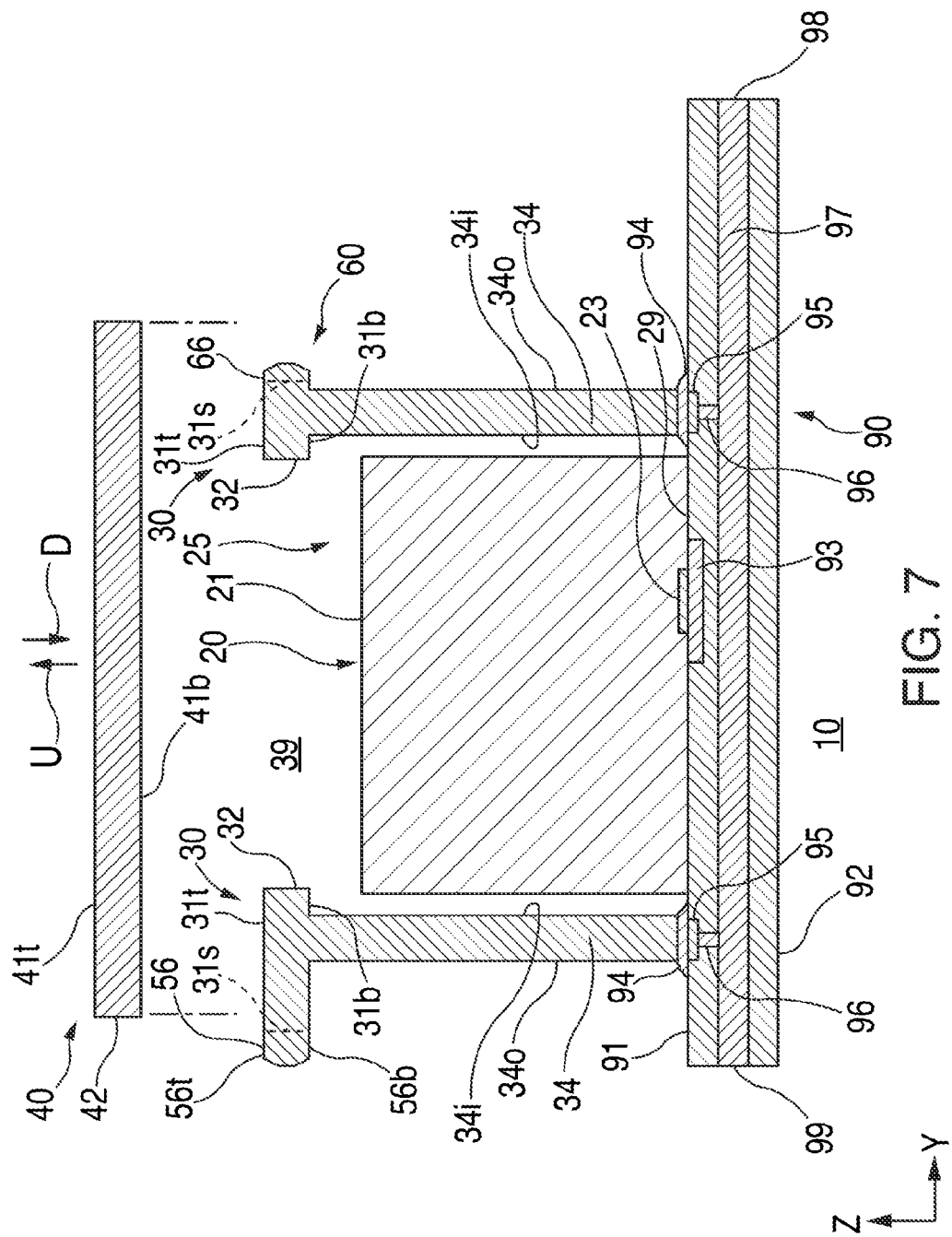
FIG. 7 is a partial cross-sectional view of the portion of the electronic device and the shield assembly of FIGS. 1-6, taken from line VII-VII of FIG. 5.
Figure 9:
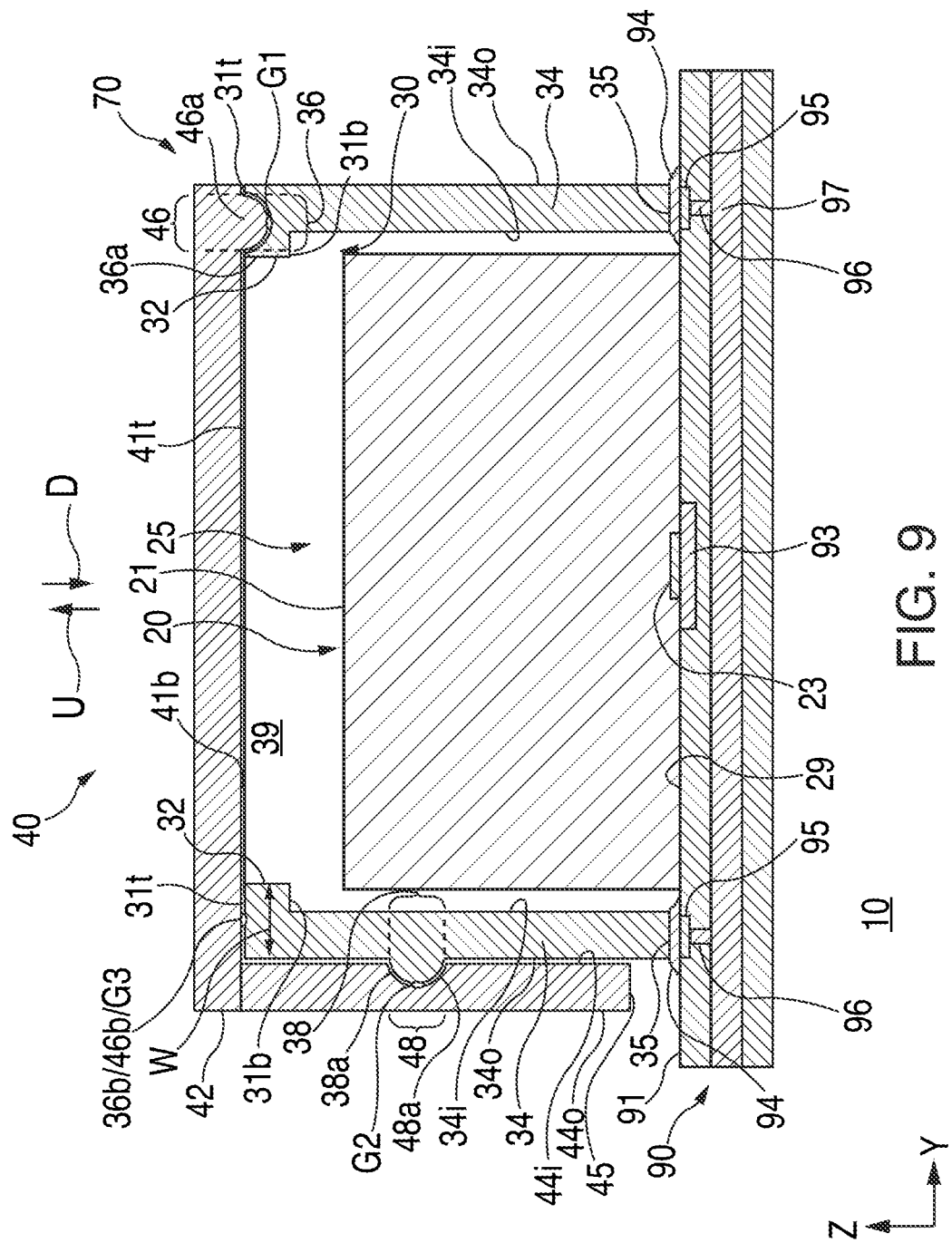
FIG. 9 is a partial cross-sectional view of the portion of the electronic device and the shield assembly of FIGS. 1-8, taken from line IX-IX of FIG. 8.

Moreover, circuit board 90 may include one or more ground or common voltage contact regions 95. Each common voltage contact region 95 may, for example, be provided on top surface 91 of circuit board 90. As shown in FIGS. 4, 7, and 9, for example, each common voltage contact region 95 may be electrically coupled to a ground or common voltage plane 97 of circuit board 90 through a respective via 96. It is to be understood that each component contact region 23, board contact region 93, and common voltage contact region 95 may have any of a variety of shapes, sizes, and locations relative to the remainder of the associated electronic component 20 or circuit board 90.

FIGS. 1-9 illustrate shield assembly 70 in various stages of assemblage. When fully assembled, shield assembly 70 may protect a circuitry region 25 of electronic device 10 from interference, and each circuitry region 25 may include one or more electronic components. For example, as shown in FIGS. 1-9, circuitry region 25 may include electronic component 20 protected by shield assembly 70. Shield assembly 70 may include a shield fence 30 and a shield lid 40. Shield fence 30 may be provided about the periphery of circuitry region 25 and may be coupled to circuit board 90. Shield lid 40 may be coupled to shield fence 30. Although FIGS. 1-9 only show one electronic component (i.e., component 20) included within circuitry region 25, in other embodiments, two or more electronic components may be included within the circuitry region protected by shield assembly 70.

According to some embodiments, shield fence 30 may include a fence body 32 and a number of fence fingers 34. Each fence finger 34 may extend from a body fence finger portion 33 coupled to fence body 32, downwardly away from fence body 32, to a free-end fence finger portion 35. At least some free-end fence finger portions 35 of shield fence 30 may be coupled to top surface 91 of circuit board 90 about and/or adjacent to electronic component 20. According to some embodiments, shield lid 40 may include a lid body 42. Moreover, in some embodiments, shield lid 40 may also include at least one lid finger 44. Each lid finger 44 may extend from a body lid finger portion 43 coupled to lid body 42, downwardly away from lid body 42, to a free-end lid finger portion 45. When shield assembly 70 is fully assembled (see, e.g., FIGS. 8 and 9), portions of shield lid 40 may be electrically coupled to respective portions of shield fence 30 for forming an interference shield about circuitry region 25. For example, when shield assembly 70 is fully assembled, at least a portion of lid body 42 of shield lid 40 may be electrically coupled to a portion of fence body 32 of shield fence 30. Additionally or alternatively, in some embodiments, when shield assembly 70 is fully assembled, at least one lid finger 44 of shield lid 40 may be electrically coupled to a respective fence finger 34 of shield fence 30.

As shown in FIGS. 1-9, fence body 32 of shield fence 30 of shield assembly 70 may include a top fence body surface 31$t$ and a bottom fence body surface 31$b$. Fence body 32 may be any suitable shape. For example, as shown, fence body 32 may be rectangular with four sides. Shield fence 30 may also include any suitable number of fence fingers 34, and each fence finger 34 may have an inner fence finger surface 34$i$ and an outer fence finger surface 34$o$. For example, as shown, shield fence 30 may include eight fence fingers 34 extending from fence body 32. Although shield fence 30 is shown to include two fence fingers 34 extending from each one of the four sides of fence body 32, shield fence 30 may include any suitable number of fence fingers 34, and different sides of fence body 32 may have different numbers of fence fingers 34 extending therefrom. In some embodiments, at least one side of fence body 32 may have no fence fingers 34 extending therefrom. Fence fingers 34 may be provided to extend from any suitable positions of fence body 32 such that fence fingers 34 may be provided about at least a portion of the periphery of circuitry region 25 and/or adjacent at least a portion of circuitry region 25 when free-end fence finger portions 35 are coupled to circuit board 90.

For example, in some embodiments, as shown, at least one fence finger 34 may extend substantially perpendicularly from fence body 32 (e.g., a fence finger 34 may extend in an X-Z plane or a Y-Z plane that may be perpendicular to fence body 32 that may reside in an X-Y plane). An inner surface 34i of at least one fence finger 34 may face an adjacent side of electronic component 20 of region 25 (e.g., a side of electronic component 20 extending between top surface 21 and bottom surface 23 of component 20). Moreover, in some embodiments, as shown, at least a portion of fence body 32 may be parallel to circuit board 90 (e.g., at least a portion of top fence body surface 31t and/or at least a portion of bottom fence body surface 31b may be parallel to at least a portion of top surface 91 of circuit board 90).

Figure 2:
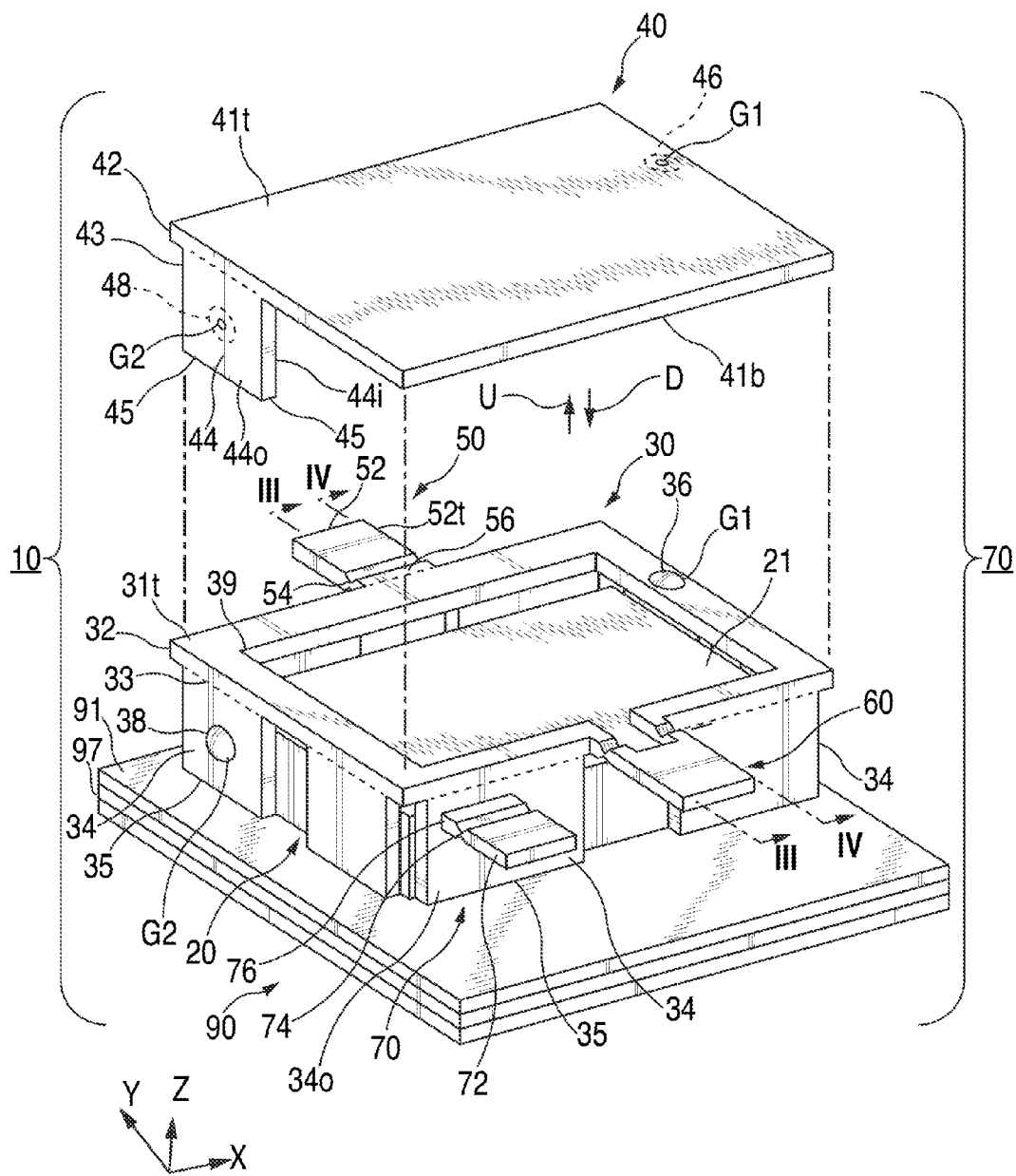
FIG. 2 is an isometric view, similar to FIG. 1, of the portion of the electronic device and the shield assembly of FIG. 1, in a second stage of assemblage, in accordance with some embodiments of the invention.

Shield fence 30 may also include at least one fence body opening 39 that may be provided through fence body 32 between top surface 31t and bottom surface 31b. For example, as shown in FIG. 2, when shield fence 30 is coupled to circuit board 90, electronic component 20 of circuitry region 25 may be accessible through opening 39 (e.g., component 20 may be passed through opening 39 and coupled to board 90 after shield fence 30 is coupled to board 90, and then an underfill (e.g., hardening epoxy material) may then be applied between component 20 and board 90 using needle applicators that may access the appropriate portions of component 20 through opening 39, or fence 30 may be coupled to board 90 after component 20 is coupled to board 90).

As also shown in FIGS. 1-9, lid body 42 of shield lid 40 of shield assembly 70 may include a top lid body surface 41t and a bottom lid body surface 41b. Lid body 42 may be any suitable shape. For example, as shown, lid body 42 may be rectangular with four sides. In some embodiments, lid body 42 may be a stainless steel sheet cut to match the surface area of top fence body surface 31t and opening 39, which may then be attached to top fence body surface 31t for covering opening 39. Shield lid 40 may also include any suitable number of lid fingers 44, and each lid finger 44 may have an inner lid finger surface 44i and an outer lid finger surface 44o. For example, as shown, shield lid 40 may include a single lid finger 44 extending from lid body 42. Although shield lid 40 is shown to include only a single lid finger 44 extending from a single side of lid body 42, shield lid 40 may include any suitable number of lid fingers 44, and different sides of lid body 42 may have different numbers of lid fingers 44 extending therefrom. For example, in some embodiments, two lid fingers 44 may extend from each one of the four sides of lid body 42. Alternatively, two lid fingers 44 may extend from three of the four sides of lid body 42, and no lid fingers may extend from the fourth side of lid body 42. Each lid finger 44 may be provided to extend from any suitable position of lid body 42 such that each lid finger 44 may be provided about at least a portion of the periphery of circuitry region 25 when shield fence 30 is coupled to circuit board 90 and shield lid 40.

In some embodiments, as shown, at least one lid finger 44 may extend substantially perpendicularly from lid body 42 (e.g., lid finger 44 may extend in an X-Z plane or a Y-Z plane that may be perpendicular to lid body 42 that may reside in an X-Y plane). Alternatively or additionally, as shown, an inner surface 44i of at least one lid finger 44 may extend adjacent to and face an outer surface 34o of a fence finger 34. Moreover, in some embodiments, as shown, at least a portion of lid body 42 may be parallel to circuit board 90 (e.g., at least a portion of top lid body surface 41t and/or at least a portion of bottom lid body surface 41b may be parallel to at least a portion of top surface 91 of circuit board 90). Moreover, in some embodiments, as shown, at least a portion of lid body 42 may be parallel to fence body 32 (e.g., at least a portion of top lid body surface 41t and/or at least a portion of bottom lid body surface 41b may be parallel to at least a portion of top fence body surface 31t and/or at least a portion of bottom fence body surface 31b of fence body 32).

Figure 8:
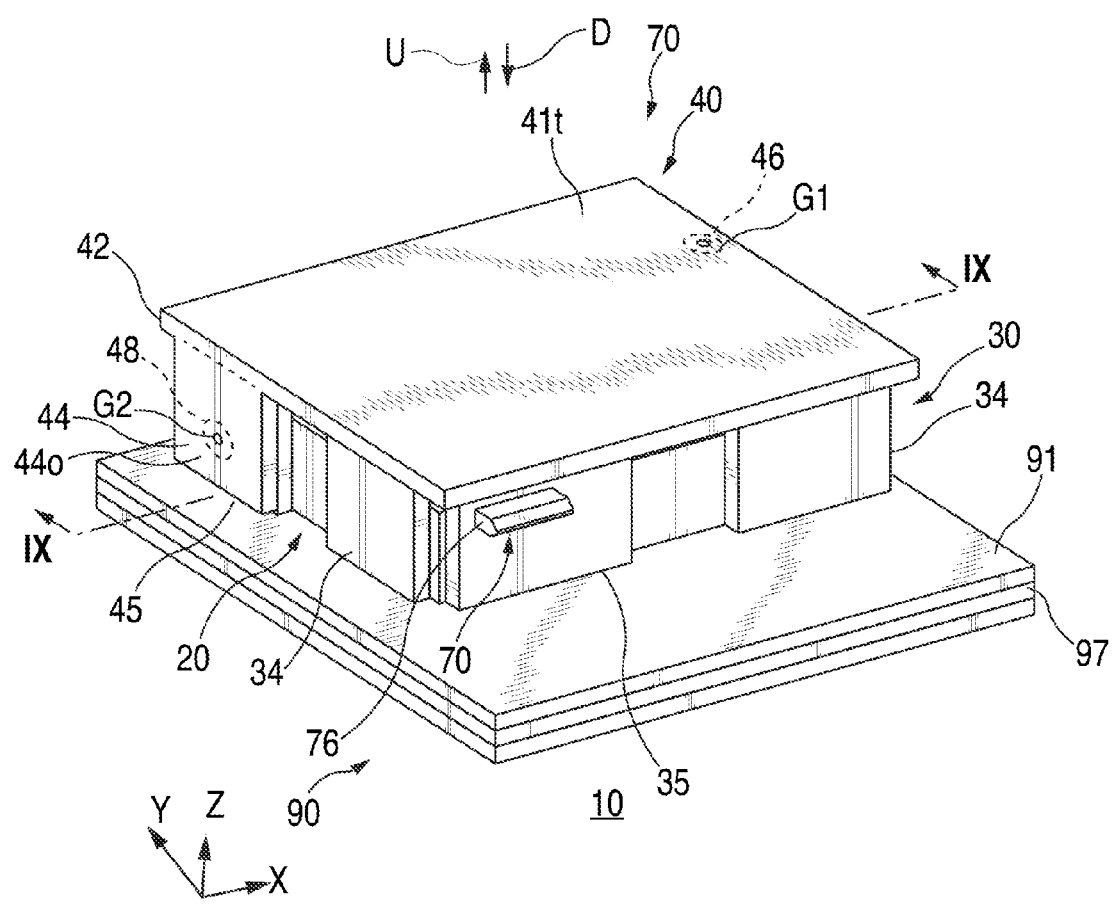
FIG. 8 is an isometric view, similar to FIGS. 1, 2, and 5, of the portion of the electronic device and the shield assembly of FIGS. 1-7, in a fourth stage of assemblage, in accordance with some embodiments of the invention.

Shield assembly 70 may be assembled about circuitry region 25 in various suitable ways. For example, in some embodiments, shield fence 30 may be coupled to circuit board 90 about circuitry region 25 (e.g., by lowering shield fence 30 in the direction of arrow D of FIG. 1 onto circuit board 90), and then shield lid 40 may be coupled to shield fence 30 (e.g., by lowering shield lid 40 in the direction of arrow D of FIGS. 2-7 onto shield fence 30). In other embodiments, shield lid 40 may be coupled to shield fence 30, and then shield fence 30 may be coupled to circuit board 90 about circuitry region 25. Lid body 42 may be configured to cover at least a portion or the entirety of fence body opening 39 when lid 40 is coupled to fence 30 for forming shield assembly 70. For example, as shown in FIGS. 8 and 9, when assembly 70 is assembled, bottom surface 41b of lid body 42 may face top surface 31t of fence body 32 and lid body 42 may cover opening 39.

Shield fence 30 may be coupled to circuit board 90 by coupling at least one free-end fence finger portion 35 to top surface 91 of circuit board 90, for example, such that free-end fence finger portions 35 of shield fence 30 may circumscribe at least a portion of circuitry region 25 (e.g., at least a portion of bottom surface 29 of electronic component 20). Shield fence 30 may be electrically coupled to at least one common voltage contact region 95 of circuit board 90. For example, as shown in FIGS. 4, 7, and 9, at least a portion of one free-end fence finger portion 35 of shield fence 30, or each free-end fence finger portion 35 of shield fence 30, may be disposed on top of and electrically coupled to a common voltage contact region 95 (e.g., via solder 94 and/or various other types of surface-mount technology ("SMT")). However, in other embodiments, a portion of shield fence 30 may be electrically coupled to a common voltage contact region 95 in various other ways, such as via a wire (not shown). At least one free-end fence finger portion 35 of shield fence 30 may be fixedly attached to circuit board 90, such that shield assembly 70 may maintain its positional relationship with respect to circuitry region 25 for providing interference shielding. For example, solder 94 may not only electrically couple a free-end fence finger portion 35 to circuit board 90, but it may also fix fence shield 30 to circuit board 90. Alternatively, shield fence 30 may be electrically coupled to circuit board 90 and fixed to circuit board 90 using different techniques. For example, a first portion of shield fence 30 may be electrically coupled to a common voltage contact region 95 of circuit board 90 by a wire or by simply resting a first portion of shield fence 30 on top of a common voltage contact region 95, while a second portion of shield fence 30 may be fixedly attached to circuit board 90 by a screw, adhesive, or any other suitable securing technique.

Shield lid 40 may then be coupled to shield fence 30 in one or more various ways. For example, in some embodiments, lid body 42 may be lowered towards fence body 32 in the direction of arrow D, such that bottom lid body surface 41b may align with at least a portion of top fence body surface 31t in order to be coupled to one another. For example, lid body 42 may be a stainless steel sheet with bottom lid body surface 41b cut to match the surface area of top fence body surface 31t and opening 39, such that bottom lid body surface 41b may be electrically coupled to top fence body surface 31t about opening 39 for shielding circuitry region 25.

Shield lid 40 may be coupled to shield fence 30 by interlocking at least one interlocking lid feature 46 of shield lid 40 with at least one respective interlocking fence feature 36 of shield fence 30 when shield assembly 70 is fully assembled. An interlocking fence feature 36 and an associated interlocking lid feature 46 may include any suitable elements that may interlock or otherwise interact with one another in any suitable manner for restricting the movement of shield lid 40 with respect to shield fence 30 in at least one direction or at least one degree of freedom when shield assembly 70 is fully assembled. Moreover, in some embodiments, the elements of an interlocking fence feature 36 and an associated interlocking lid feature 46 may also interlock or otherwise interact with one another to ensure or at least promote an interference fit or any suitable contact between one another. Such contact may electrically couple shield lid 40 to shield fence 30 for providing a ground point (e.g., G1) that may allow shield assembly 70 to properly shield electrical region 25 when shield assembly 70 is fully assembled. The elements of an interlocking fence feature 36 and an associated interlocking lid feature 46 may include any suitable elements that may appropriately interlock or otherwise interact with one another in any suitable manner, such as a protrusion/hole interaction, a flange/recess interaction, or any other suitable mechanical interaction.

For example, as shown in FIG. 9, an interlocking lid feature 46 of shield lid 40 may include a dimple or protrusion 46a extending downwardly away from bottom lid body surface 41b of lid body 42, and an associated interlocking fence feature 36 of shield fence 30 may include a hole 36a extending through top fence body surface 31t of fence body 32. When shield lid 40 is lowered over shield fence 30 in the direction of arrow D, bottom lid body surface 41b may align with at least a portion of top fence body surface 31t such that at least a portion of protrusion 46a may be configured to at least partially enter or otherwise interact with hole 36a. Once shield lid 40 is lowered over shield fence 30 in the direction of arrow D far enough that protrusion 46a has snapped into, entered into, or otherwise interacted with hole 36a, protrusion 46a may interact with a portion of fence body 32 about hole 36a to prevent or severely limit the movement of shield lid 40 with respect to shield fence 30 in at least one, if not all three, of the X-direction, the Y-direction, and the Z-direction. Moreover, protrusion 46a and hole 36a may be relatively sized to ensure or at least promote an interference fit or any suitable contact between protrusion 46a and a portion of fence body 32 about hole 36a. Such contact between protrusion 46a and a portion of fence body 32 about hole 36a may electrically couple shield lid 40 to shield fence 30, which may provide at least one ground point G1, and which may allow shield assembly 70 to properly shield electrical region 25.

In addition to or as an alternative to interlocking one or more interlocking fence features 36 with one or more interlocking lid features 46, shield lid 40 may additionally or alternatively be coupled to shield fence 30 by ensuring contact between at least one contacting lid feature 48 of shield lid 40 with at least one respective contacting fence feature 38 of shield fence 30 when shield assembly 70 is fully assembled. A contacting fence feature 38 and an associated contacting lid feature 48 may include any suitable elements that may ensure contact between features 38 and 48 in any suitable manner for electrically coupling shield lid 40 to shield fence 30 for providing a ground point (e.g., G2) that may allow shield assembly 70 to properly shield electrical region 25 when shield assembly 70 is fully assembled. The elements of a contacting fence feature 38 and an associated contacting lid feature 48 may include any suitable elements that may appropriately ensure contact between features 38 and 48 in any suitable manner.

For example, as shown in FIG. 9, a contacting fence feature 38 of shield fence 30 may include a dimple or protrusion 38a extending out away from an outer fence finger surface 34o of a fence finger 34, and an associated contacting lid feature 48 of shield lid 40 may include a flat or substantially flat surface portion 48a along an inner lid finger surface 44i of lid finger 44. In some embodiments, when shield lid 40 is lowered over shield fence 30 in the direction of arrow D, not only may protrusion 46a be configured to interact with hole 36a, but at least a portion of inner lid finger surface 44i may align with at least a portion of outer fence finger surface 34o such that protrusion 38a of shield fence 30 may be configured to initiate and maintain contact with surface portion 48a of shield lid 40. Once shield lid 40 is lowered over shield fence 30 in the direction of arrow D far enough that protrusion 38a has contacted surface portion 48a, protrusion 38a may be configured to (e.g., biased or sized to) interact with surface portion 48a of lid finger 44 to ensure and maintain suitable contact between protrusion 38a and surface portion 48a of lid finger 44 for electrically coupling shield lid 40 to shield fence 30, which may provide a ground point G2 at the point of contact that may allow shield assembly 70 to properly shield electrical region 25. This may ensure contact between a lid finger 44 and a fence finger 34 in a Y-Z plane extending along a side of circuitry region 25.

Although only one set of interlocking features 36/46 and only one set of contacting features 38/48 may be shown in FIGS. 1-9, shield assembly 70 may include any number of sets of interlocking features 36/46 and/or any number of sets of contacting features 38/48 for providing any number of ground points between shield 30 and lid 40 for properly shielding electrical region 25.

In some embodiments, when shield fence 30 is coupled to circuit board 90, as shown in FIGS. 2-9, shield fence 30 may be fixedly attached to circuit board 90 such that a user (e.g., a manufacturer of device 10) may not detach shield fence 30 from circuit board 90 (e.g., in the direction of arrow U of FIG. 2) without a tool or without damaging the element or elements that fixedly attach fence 30 to board 90. For example, if a screw (not shown) fixedly attaches shield fence 30 to circuit board 90, then a user may need a screwdriver to detach shield fence 30 from circuit board 90. As another example, if solder 94 fixedly attaches shield fence 30 to circuit board 90, as shown in FIGS. 2-9, then a user may need to irreversibly break solder 94 to detach shield fence 30 from circuit board 90 (e.g., new solder 94 may be needed to fixedly reattach shield fence 30 to circuit board 90).

However, when shield fence 30 is coupled to shield lid 40, as shown in FIGS. 8 and 9, shield lid 40 may be removably coupled to shield fence 30 such that a user (e.g., a manufacturer of device 10) may uncouple shield lid 40 from shield fence 30 (e.g., in the direction of arrow U of FIG. 5) without a tool or without damaging or otherwise impairing the element or elements that removably couple fence 30 to lid 40. For example, the interaction between each interlocking lid feature 46 of shield lid 40 and its associated interlocking fence feature 36 of shield fence 30 may not prevent a user from uncoupling lid 40 from fence 30 and/or may not irreversibly break when lid 40 is uncoupled from fence 30. That is, at least one interlocking lid feature 46 of shield lid 40 and its associated interlocking fence feature 36 of shield fence 30 may not be impaired when lid 40 is uncoupled from fence 30. Similarly, the interaction between each contacting lid feature 48 of shield lid 40 and its associated contacting fence feature 38 of shield fence 30 may not prevent a user from uncoupling lid 40 from fence 30 and/or may not irreversibly break when lid 40 is uncoupled from fence 30. That is, at least one contacting lid feature 48 of shield lid 40 and its associated contacting fence feature 38 of shield fence 30 may not be impaired when lid 40 is uncoupled from fence 30. Therefore, even after shield assembly 70 is fully assembled, a user may uncouple shield lid 40 from shield fence 30 (e.g., to access electronic region 25 through fence body opening 39 of fence body 32) without breaking or impairing one or more features 36, 38, 46, or 48.

Alternatively, in some embodiments, when shield fence 30 is coupled to shield lid 40, as shown in FIGS. 8 and 9, shield lid 40 may be fixedly attached to shield fence 30 such that a user (e.g., a manufacturer of device 10) may not detach shield lid 40 from shield fence 30 (e.g., in the direction of arrow U of FIG. 8) without a tool or without damaging the element or elements that fixedly attach fence 30 to board 90. For example, in some embodiments, shield lid 40 may be spot welded, laser welded, or soldered to shield fence 30 (e.g., bottom lid body surface 41b may be fixedly attached to top fence body surface 41t using one or more instances of welding or solder as a set of interlocking features 36/46 and a ground point (e.g., interlocking features 36b/46b and ground point G3 of FIG. 9)).

Every ground point of shield assembly 70 (e.g., G1-G3) may together define a closed loop of ground points along/about lid 40. In some embodiments, in order for shield assembly 70 to provide appropriate interference shielding, each particular ground point of the closed loop may not be positioned more than a maximum threshold distance away from each of the two ground points adjacent to that particular ground point in the loop. For example, in some embodiments, any two adjacent ground points in a closed loop of ground points provided by shield assembly 70 must be positioned within a particular threshold distance of one another (e.g., 3.0 millimeters). Although lid body 42 is only shown to electrically couple with fence body 32 at ground points G1 and G3 positioned above fence fingers 34, lid body 42 and fence body 32 may share any number of ground points about opening 39 (e.g., all about opening 39 along top fence body surface 31t).

Shield fence 30 and shield lid 40 may each be formed from any suitable material or groups of materials that may be at least partially conductive for shielding circuitry region 25. For example, each one of shield fence 30 and shield lid 40 may be formed from any suitable metal, such as aluminum. In some embodiments, each one of fence 30 and lid 40 may be formed from a single piece of solid material. The single piece of material may, for example, be a piece of flat stock (e.g., sheet metal). Each one of fence 30 and lid 40 may be formed by one or more various suitable processes including, but not limited to, a machining process, an extrusion process, a forging process, and combinations thereof. For example, in some embodiments, each one of fence 30 and lid 40 may be at least partially formed by a forging process, which may include a process of working a hot or cold material, such as metal, to a desired shape by impact or pressure from hammers, presses, or forging machines. For example, forging may be used to help form the edges of fence body 32, the edges of lid body 42, the intersection of fence body 32 with one or more fence fingers 34, and/or the intersection of lid body 42 with one or more lid fingers 44.

Additionally or alternatively, the process of forming each one of fence 30 and lid 40 may include drawing, and further deep drawing. Drawing may refer to forming sheet metal into shapes, such as cylindrical or box shaped parts, by using a punch that may press the sheet metal into a die cavity. Drawing may also refer to placing a flat blank over a shaped punch to draw the flat material over a die, thereby creating a formed shape. In some embodiments, one or more drawing techniques may be used to form the general shape of shield fence 30 and/or shield lid 40, and thereafter forging may be used to adjust the thickness of the material at specific locations around the shaped part (e.g., forging can be used to create sharp edges at locations where drawing may have created edges with a radius).

One or more machining processes may further be applied to clean up one or more surfaces of shield fence 30 and/or shield lid 40 after other processes have been implemented. For example, machining may be used to clean up forged surfaces. Forging may be used to create coarse sharp corners and machining may be used to create fine sharp corners. As another example, forging may be used to over mold corners or edges of shield fence 30 and/or shield lid 40 so that there may be enough material to machine. Machining may also be used to add features on shield fence 30 and/or shield lid 40. For example, one or more fence body openings 39 may be machined into or through fence body 32. Additionally or alternatively, hole 36a may be machined into or through fence 30, and/or protrusion 38a and protrusion 46a may be forged, machined, drawn, or otherwise formed from fence 30 or lid 40. Moreover, spacings 37 provided between adjacent fence fingers 34 and/or spacings provided between adjacent lid fingers 44 may be machined, drawn, or otherwise formed into or through fence 30 or lid 40. Moreover, one or more other features of assembly 70, such as screw holes, posts, standoffs, bosses, recesses, and the like, may be created on or through surfaces of assembly 70. Additionally or alternatively, other processes may be utilized for forming shield fence 30 and/or shield lid 40, including, for example, punching, stamping, polishing, applying surface finishes (e.g., sand blasting, anodizing, etc.), ironing, extruding, cutting, molding, and the like.

As shown in FIGS. 1 and 9, for example, fence body 32 may have a width W, at least along a portion of top fence body surface 31t. In some embodiments, as shown in FIGS. 1-9, this width W may be the same about substantially the entirety of opening 39. For example, width W may be in the range of 0.2 millimeters to 2.0 millimeters. In some embodiments, width W may be in the range of 0.8 millimeters to 1.6 millimeters. In some embodiments, width W may be about 1.2 millimeters or any other suitable width. Width W may be chosen to be big enough to provide shield fence 30 with enough stability to retain its shape during use, while also being small enough that opening 39 may be as large as possible for accommodating large components therethrough. In some embodiments, despite the geometry of fence body 32 (e.g., width W) that may be chosen to meet the functional requirements of device 10, shield fence 30 may also be provided with one or more tabs that may be releasably coupled to shield fence 30 for providing stability during the manufacturing of shield fence 30 and/or during the subsequent handling of shield fence 30 when assembling assembly 70.

For example, as shown in FIGS. 1-4, shield fence 30 may include a first tab assembly 50. Tab assembly 50 may include a tab 52 that may be releasably coupled to at least one tab extension 56 via at least one weakening feature 54. Each tab extension 56 may be fixedly coupled to shield fence 30. In some embodiments, as shown in FIGS. 1-4, a single tab extension 56 may extend at one end from an external side fence body surface 31s of fence body 32 (e.g., a portion of fence body 32 extending between top fence body surface 31t and bottom fence body surface 31b that is not exposed to opening 39), and tab 52 may extend from another end of tab extension 56. At least one weakening feature 54 may be provided between tab 52 and extension 56 that may promote the breaking away of tab 52 from extension 56.

As shown in FIG. 1, for example, a top surface 52t of tab 52 may have a length A and a width B that may define a surface area C. Length A and width B may be chosen to define a particularly sized and shaped surface area C that may be appropriate for use in manufacturing and/or handling shield fence 30. For example, length A and/or width B may be designed to be greater than width W of fence body 32 such that top surface 52t of tab 52 may provide a larger surface area C than may be provided by an adjacent portion of top surface 31t of fence body 32 (e.g., such that the size and shape of top surface 52t of tab 52 is greater than the size and shape of any portion of top surface 31t of fence body 32). This geometry of tab assembly 50 may enable shield fence 30 to be held at surface area C by a tool that may not otherwise be able to successfully interact with shield fence 30 at a smaller surface area of fence body 32. For example, a vacuum head (not shown) that may be used during the manufacturing of shield fence 30 and/or during the positioning of shield fence 30 on circuit board 90 may require a surface area of at least 3.0 millimeters by at least 3.0 millimeters on a surface of shield fence 30 in order to successfully pick up shield fence 30. Thus, if the normal surface area defined by top surface 31t of fence body 32 (e.g., as defined by width W) is not large enough to interact with a certain tool, tab 52 of tab assembly 50 may be designed such that surface area C may be ample. For example, in some embodiments, length A may be in the range of 3.0 millimeters to 3.3 millimeters and width B may be in the range of 3.0 millimeters to 3.3 millimeters.

Weakening feature 54 of tab assembly 50 may be any suitable feature or combination of features suitable to provide at least one breaking point at which tab 52 may be releasable from extension 56 (e.g., after surface area C or any other geometry or property of tab 52 has been utilized). For example, weakening feature 54 may include one or more cuts or perforations into or through one or more surfaces of tab assembly 50, solder or welding that may temporarily hold tab 52 to extension 56, half shears, or combinations thereof.

Figure 3:
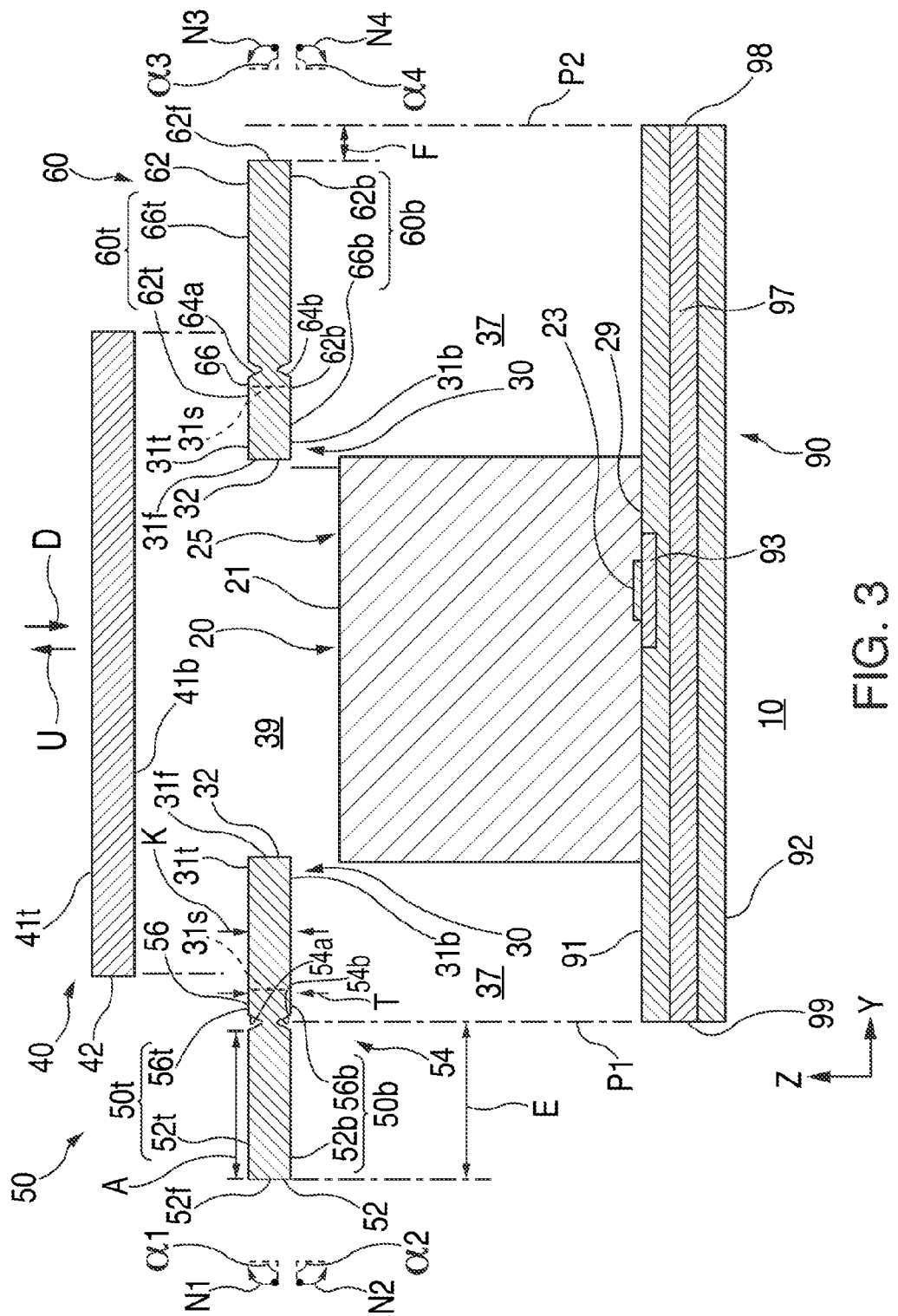
FIG. 3 is a partial cross-sectional view of the portion of the electronic device and the shield assembly of FIGS. 1 and 2, taken from line III-III of FIG. 2.

As shown, in FIG. 3, for example, weakening feature 54 may include a first V-cut 54a formed into a first surface of tab assembly 50 (e.g., into a top surface 50t of tab assembly 50 that may extend from a top surface 52t of tab 52 to a top surface 56t of extension 56, and that may be co-planar with at least a portion of top fence body surface 31t) and/or a second V-cut 54b formed into a second surface of tab assembly 50 (e.g., into a bottom surface 50b of tab assembly 50 that may extend from a bottom surface 52b of tab 52 to a bottom surface 56b of extension 56, and that may be co-planar with at least a portion of bottom fence body surface 31b). In some embodiments, as shown, first V-cut 54a and second V-cut 54b may at least partially overlap (e.g., in an X-Z plane) such that they may cooperate to provide a defined break away zone for tab assembly 50.

In some embodiments, tab assembly 50 may be formed as an integral continuous portion of shield fence 30. For example, extension 56 and tab 52 may initially be a single continuous piece of material that may extend from a portion of fence body 32 (e.g., away from side surface 31s). In some embodiments, tab assembly 50 may be formed in a single process with the formation of at least one other portion of shield fence 30. For example, tab 52, extension 56, and at least a portion of fence body 32 may be formed from a single piece of material (e.g., aluminum), and then feature 54 may be formed. This may increase the rigidity of tab assembly 50. In other embodiments, tab assembly 50 may be initially independent from shield fence 30 and then releasably coupled to shield fence 30. As shown in FIG. 3, for example, extension 56 may have a thickness T between top surface 56t and bottom surface 56b, which may be similar or equal to a thickness K of fence body 32 between top surface 31t and bottom surface 31b, while first V-cut 54a may have a thickness Da and second V-cut 54b may have a thickness Db, such that a portion (e.g., a break away zone) of tab assembly 50 between first V-cut 54a and second V-cut 54b may have a thickness R. For example, thickness T may be about 0.15 millimeters, while thickness Da may be about 0.05 millimeters, thickness Db may be about 0.05 millimeters, and thickness R may be about 0.05 millimeters, such that the remaining thickness R of tab assembly 50 at weakening feature 54 may be about 33% of the total thickness T of tab assembly 50. In some embodiments, extension 56 may not be necessary and weakening feature 54 of tab assembly 50 may be provided directly between tab 52 and a portion of shield fence 30 (e.g., fence body 32).

After the geometry or any other useful property of tab 52 has been utilized during the manufacturing and/or handling of shield fence 30 (e.g., after surface area C of tab 52 has been utilized by a vacuum head for properly positioning shield fence 30 about region 25 on circuit board 90), tab 52 may be broken away from extension 56 and/or the remainder of shield fence 30 at each weakening feature 54. For example, as shown in FIGS. 3 and 4, when weakening feature 54 extends along an X-Z plane, tab 52 may be bent with respect to feature 54 in one or more directions in a Y-Z plane (e.g., in one or more of directions N1 and N2). In some embodiments, tab assembly 50 may be configured such that tab 52 may break away from extension 56 at feature 54, at least after three out of plane bends of tab 52 (e.g., in direction N1, then in direction N2, and then back in direction N1, where angle α1 of direction N1 may equal 90° and angle α2 of direction N2 may equal 90°).

As shown, each one of V-cuts 54a and 54b may extend along the entire length A of tab 52. Alternatively, each V-cut or any other type of weakening feature may only extend along one or more discrete portions of length A. For example, weakening feature 54 may alternatively include multiple discrete perforations at least partially through tab assembly 50 (e.g., between top surface 50t and bottom surface 50b). Weakening feature 54 may be any suitable feature or group of features that may be configured to provide tab assembly 50 with sufficient rigidity or stability such that tab 52 may be utilized to manipulate shield fence 30 during its manufacturing or handling, while at the same time being configured to allow tab 52 to be broken away from the remainder of shield fence 30 after tab 52 has been utilized (e.g., to save space within device 10). Each weakening feature 54 may be formed during the initial creation of shield fence 30 (e.g., as the last or one of the last steps during the creation of fence 30), and/or right before shield fence 30 is coupled to circuit board 90, and/or after shield fence 30 is coupled to circuit board 90.

In some embodiments, when tab 52 is to be removed from shield fence 30 after shield fence 30 has been coupled to circuit board 90, one or more coupling points of shield fence 30 to board 90 may be leveraged to aid in the removal of tab 52. All or at least a portion of tab assembly 50 may be positioned adjacent to a fence finger 34 (e.g., all or at least a portion of tab assembly 50 may extend from a portion of fence body 32 from which a fence finger 34 also extends, as shown in FIG. 4), and/or all or at least a portion of tab assembly 50 may be positioned between two fence fingers 34 (e.g., all or at least a portion of tab assembly 50 may extend from a portion of fence body 32 that extends between two adjacent fence fingers 34, as shown in FIG. 3), such that the fixed coupling (e.g., solder 94) of circuit board 90 to a free-end fence finger portion 35 of each fence finger 34 proximal to tab assembly 50 may provide leverage for the force that may be required to break tab 52 away from the remainder of shield fence 30. For example, as shown in FIG. 4, at least one portion of weakening feature 54 may be in the same Y-Z plane as a portion of a fence finger 34 fixed to circuit board 90 via coupling 94. This attachment of fence finger 34 to circuit board 90 may enable tab 52 to be bent in direction N1 and/or direction N2 with enough force to break tab 52 away from the remainder of shield fence 30 at that portion of weakening feature 54. Additionally or alternatively, as shown in FIG. 3, at least one portion of weakening feature 54 may be in the same Y-Z plane as a portion of a spacing 37 between two adjacent fence fingers 34 fixed to circuit board 90 via couplings 94, such that the attachment of each of the two adjacent fence fingers 34 to circuit board 90 may enable tab 52 to be bent in direction N1 and/or direction N2 with enough force to break tab 52 away from the remainder of shield fence 30 at that portion of weakening feature 54.

In some embodiments, at least a portion of tab assembly 50 may extend over and/or beyond an edge or surface of circuit board 90 such that there may be space adjacent to and/or below board 90 that may be used for leverage when removing tab 52 from the remainder of shield fence 30. For example, as shown in FIGS. 3, 4, 6, and 7, shield fence 30 may be coupled to circuit board 90 such that a side surface or edge 99 of circuit board 90, which may extend between top surface 91 and a bottom surface 92 of board 90 (e.g., from top surface 91 to bottom surface 92), may be positioned directly underneath a portion of tab assembly 50. As shown, a plane P1 including surface 99 (e.g., surface 99 resides in plane P1) may intersect any suitable portion of tab assembly 50 (e.g., a portion of tab assembly 50 may extend through plane P1), such as weakening feature 54, such that a free-end 52f of tab 52 may extend beyond plane P1 of surface 99 of circuit board 90 by a distance E. Distance E may be any suitable distance that may allow a tool (e.g., tweezers) to properly grab and manipulate tab 52 (e.g., in direction N1 and/or N2) without impediment from board 90, until feature 54 may release tab 52 from the remainder of shield fence 30.

Figure 5:
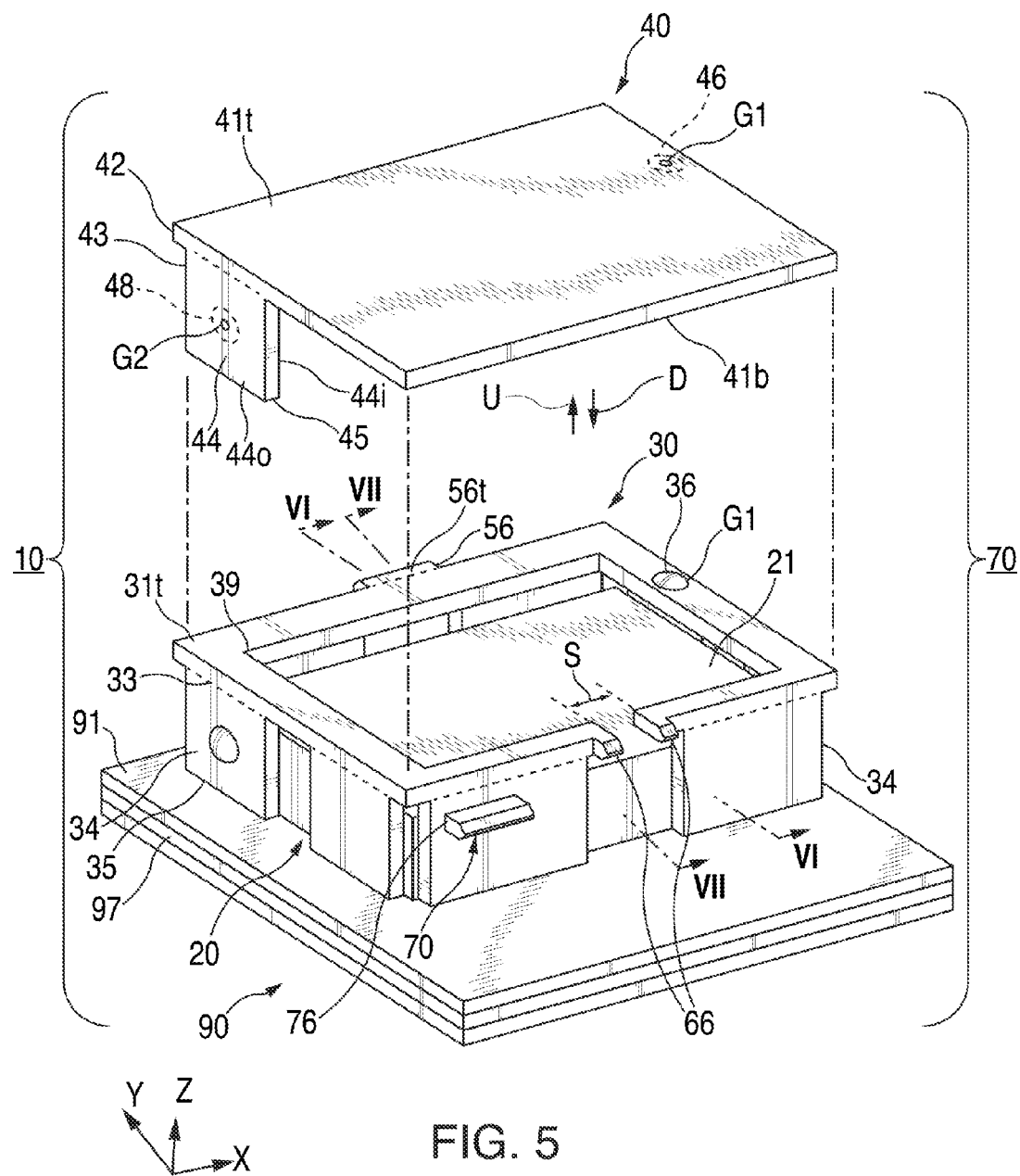
FIG. 5 is an isometric view, similar to FIGS. 1 and 2, of the portion of the electronic device and the shield assembly of FIGS. 1-4, in a third stage of assemblage, in accordance with some embodiments of the invention.
Figure 6:
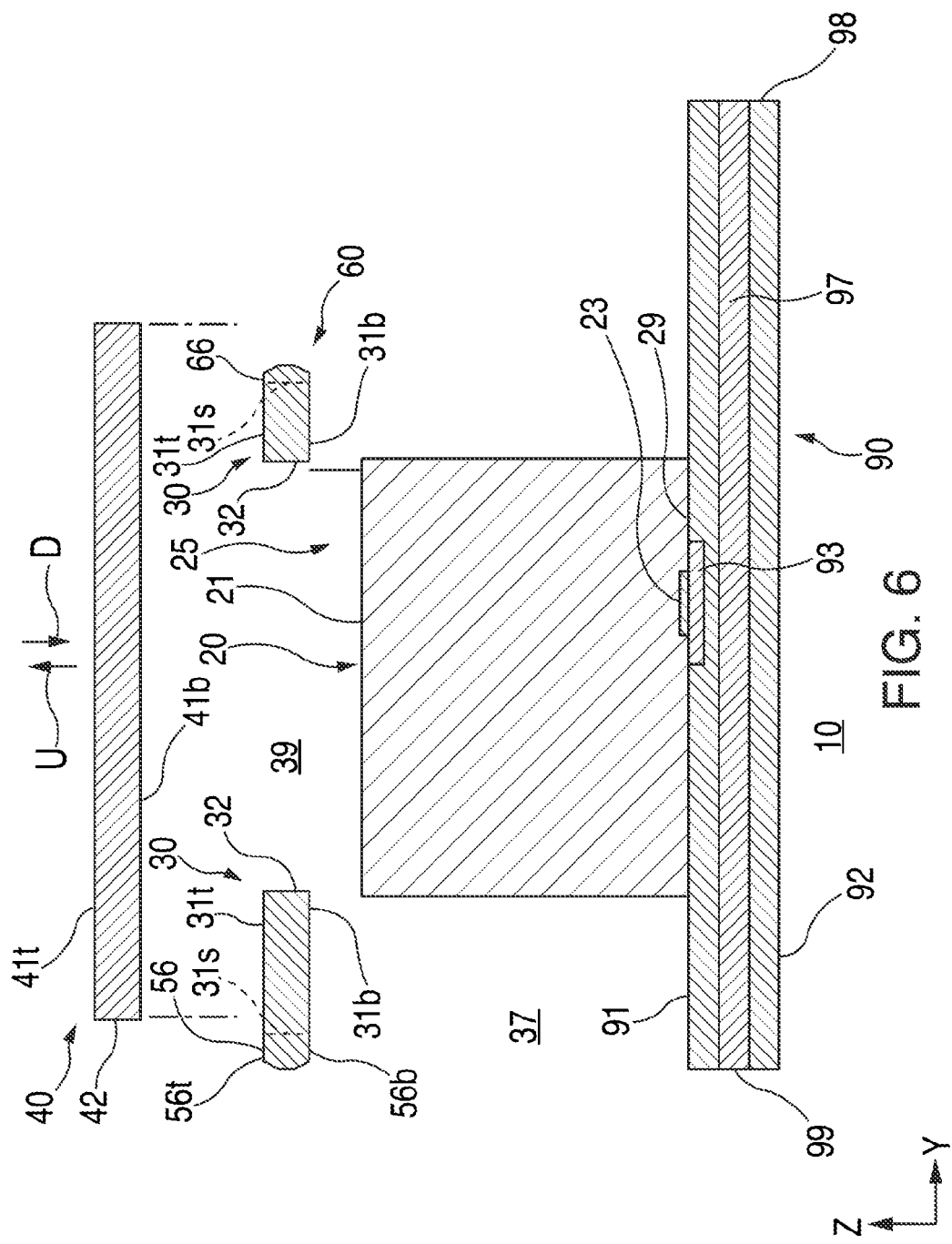
FIG. 6 is a partial cross-sectional view of the portion of the electronic device and the shield assembly of FIGS. 1-5, taken from line VI-VI of FIG. 5.

As also shown in FIGS. 1-4, for example, shield fence 30 may additionally or alternatively include a second tab assembly 60. Tab assembly 60 may be substantially similar to tab assembly 50 and may include a tab 62 that may be releasably coupled to at least one tab extension 66 via at least one weakening feature 64. Each tab extension 66 may be fixedly coupled to shield fence 30. In some embodiments, as shown in FIGS. 1-4, two tab extensions 66 may extend from distinct and separated portions of an external side fence body surface 31s of fence body 32 (e.g., distinct portions of fence body 32 separated by a spacing S, as shown in FIG. 5), and tab 62 may extend from another end of each one of the two tab extensions 66. At least one weakening feature 64 may be provided between tab 62 and each of the two extensions 66 that may promote the breaking away of tab 62 from each extension 66. As shown, removal of tab 62 from the remainder of shield fence 30 may create discontinuous walls along shield fence 30 (e.g., spacing S between two extensions 66 and two portions of fence body 32 may create discontinuity along an otherwise continuous loop of fence body 32 about opening 39).

As shown in FIG. 1, for example, a top surface 62t of tab 62 may also have a length A and a width B that may define a surface area C. Like that of tab 52, length A and width B of tab 62 may be chosen to define a particularly sized and shaped surface area C that may be appropriate for use in manufacturing and/or handling shield fence 30. This geometry of tab assembly 60 may enable shield fence 30 to be held at surface area C of tab 62 by a tool that may not otherwise be able to successfully interact with shield fence 30 at a smaller surface area of fence body 32. For example, a first vacuum head (not shown) may interact with surface area C of tab 52 while a second vacuum head (not shown) may simultaneously interact with surface area C of tab 62 during the manufacturing of shield fence 30 and/or during the positioning of shield fence 30 on circuit board 90. As shown, tab 52 and tab 62 may be positioned on opposite sides of shield fence 30 (e.g., on opposite sides of opening 39), such that a single tool or two distinct tools may simultaneously or cooperatively interact with pads 52 and 62 to evenly distribute or at least share the weight burden of shield fence 30.

Each weakening feature 64 of tab assembly 60 may be any suitable feature or combination of features suitable to provide at least one breaking point at which tab 62 may be releasable from a respective extension 66 (e.g., after surface area C or any other geometry or property of tab 62 has been utilized). For example, like weakening feature 54, each weakening feature 54 may include one or more cuts or perforations into or through one or more surfaces of tab assembly 60.

As shown, in FIGS. 3 and 4, for example, each weakening feature 64 may include a first V-cut 64a formed into a first surface of tab assembly 60 (e.g., into a top surface 60t of tab assembly 60 that may extend from a top surface 62t of tab 62 to a top surface 66t of each extension 66, and that may be co-planar with at least a portion of top fence body surface 31t) and/or a second V-cut 64b formed into a second surface of tab assembly 60 (e.g., into a bottom surface 60b of tab assembly 60 that may extend from a bottom surface 62b of tab 62 to a bottom surface 66b of extension 66, and that may be co-planar with at least a portion of bottom fence body surface 31b). In some embodiments, as shown, first V-cut 64a and second V-cut 64b may at least partially overlap (e.g., in an X-Z plane) such that they may cooperate to provide a defined break away zone for tab assembly 60 at each extension 66 on opposite sides of spacing S.

In some embodiments, tab assembly 60 may be formed as an integral continuous portion of shield fence 30. For example, each extension 66 and tab 62 may initially be a single continuous piece of material that may extend from a portion of fence body 32 (e.g., away from side surface 31s). In some embodiments, tab assembly 60 may be formed in a single process with the formation of at least one other portion of shield fence 30. For example, tab 62, each extension 66, and at least a portion of fence body 32 may be formed from a single piece of material (e.g., aluminum), and then feature 64 of each extension 66 may be formed.

After the geometry or any other useful property of tab 62 has been utilized during the manufacturing and/or handling of shield fence 30 (e.g., after surface area C of tab 62 has been utilized by a vacuum head for properly positioning shield fence 30 about region 25 on circuit board 90), tab 62 may be broken away from each extension 66 and/or the remainder of shield fence 30 at each weakening feature 64. For example, as shown in FIGS. 3 and 4, when each weakening feature 64 extends along an X-Z plane, tab 62 may be bent with respect to each feature 64 in one or more directions in a Y-Z plane (e.g., in one or more of directions N3 and N4). In some embodiments, tab assembly 60 may be configured such that tab 62 may break away from each extension 66 at its feature 64, at least after three out of plane bends of tab 62 (e.g., in direction N3, then in direction N4, and then back in direction N3, where angle α3 of direction N3 may equal 90° and angle α4 of direction N4 may equal 90°).

Like cuts 54a and 54b, each one of V-cuts 64a and 64b of each weakening feature 64 may extend along the entire length of that extension 66. Alternatively, each V-cut or any other type of weakening feature may only extend along one or more discrete portions of its extension 66. For example, each weakening feature 64 may alternatively include multiple discrete perforations at least partially through tab assembly 60 (e.g., between top surface 60t and bottom surface 60b). Each weakening feature 64 may be any suitable feature or group of features that may be configured to provide tab assembly 60 with sufficient rigidity or stability such that tab 62 may be utilized to manipulate shield fence 30 during its manufacturing or handling, while at the same time being configured to allow tab 62 to be broken away from the remainder of shield fence 30 after tab 62 has been utilized (e.g., to save space within device 10). Each weakening feature 64 may be formed during the initial creation of shield fence 30, and/or right before shield fence 30 is coupled to circuit board 90, and/or after shield fence 30 is coupled to circuit board 90.

In some embodiments, when tab 62 is to be removed from shield fence 30 after shield fence 30 has been coupled to circuit board 90, one or more coupling points of shield fence 30 to board 90 may be leveraged to aid in the removal of tab 62. All or at least a portion of tab assembly 60 may be positioned adjacent to a fence finger 34 (e.g., all or at least a portion of tab assembly 60 may extend from a portion of fence body 32 from which a fence finger 34 also extends, as shown in FIG. 4), and/or all or at least a portion of tab assembly 60 may be positioned between two fence fingers 34 (e.g., all or at least a portion of tab assembly 60 may extend from a portion of fence body 32 that extends between two adjacent fence fingers 34, as shown in FIG. 3), such that the fixed coupling (e.g., solder 94) of circuit board 90 to a free-end fence finger portion 35 of each fence finger 34 proximal to tab assembly 60 may provide leverage for the force that may be required to break tab 62 away from the remainder of shield fence 30. For example, as shown in FIG. 4, at least one portion of a weakening feature 64 may be in the same Y-Z plane as a portion of a fence finger 34 fixed to circuit board 90 via coupling 94. This attachment of fence finger 34 to circuit board 90 may enable tab 62 to be bent in direction N3 and/or direction N4 with enough force to break tab 62 away from the remainder of shield fence 30 at that portion of that weakening feature 54. Additionally or alternatively, as shown in FIG. 3, at least one portion of a weakening feature 64 may be in the same Y-Z plane as a portion of a spacing 37 between two adjacent fence fingers 34 fixed to circuit board 90 via couplings 94, such that the attachment of each of the two adjacent fence fingers 34 to circuit board 90 may enable tab 62 to be bent in direction N3 and/or direction N4 with enough force to break tab 62 away from the remainder of shield fence 30 at that portion of that weakening feature 64.

In some embodiments, a side surface or edge of circuit board 90 may extend only a certain distance beyond tab assembly 60 such that there may be space adjacent to and/or below board 90 that may be used for leverage when removing tab 62 from the remainder of shield fence 30. For example, as shown in FIGS. 3, 4, 6, and 7, shield fence 30 may be coupled to circuit board 90 such that a side surface or edge 98 of circuit board 90, which may extend between top surface 91 and a bottom surface 92 of board 90, may be positioned beyond free-end 62f of tab 62. As shown, a plane P2 including surface 98 may not intersect with any portion of tab assembly 60, such that plane P2 of surface 98 of circuit board 90 may extend beyond free-end 62f of tab 62 by a distance F. Distance F may be any suitable distance that may still allow a tool (e.g., tweezers) to properly grab and manipulate tab 62 (e.g., in direction N3 and/or N4) without impediment from board 90, until each feature 64 may release tab 62 from the remainder of shield fence 30.

As also shown in FIGS. 1 and 2, for example, shield fence 30 may additionally or alternatively include a third tab assembly 70. Tab assembly 70 may be substantially similar to tab assembly 50 and may include a tab 72 that may be releasably coupled to at least one tab extension 76 via at least one weakening feature 74. Each tab extension 76 may be fixedly coupled to shield fence 30. However, unlike tab assembly 50, each tab extension 76 of tab assembly 70 may extend from a fence finger 34 (e.g., an outer surface 34o of at least one fence finger 34), and tab 72 may extend from another end of the tab extension 76. At least one weakening feature 74 may be provided between tab 72 and each extension 76 that may promote the breaking away of tab 72 from each extension 76.

Figure 10:
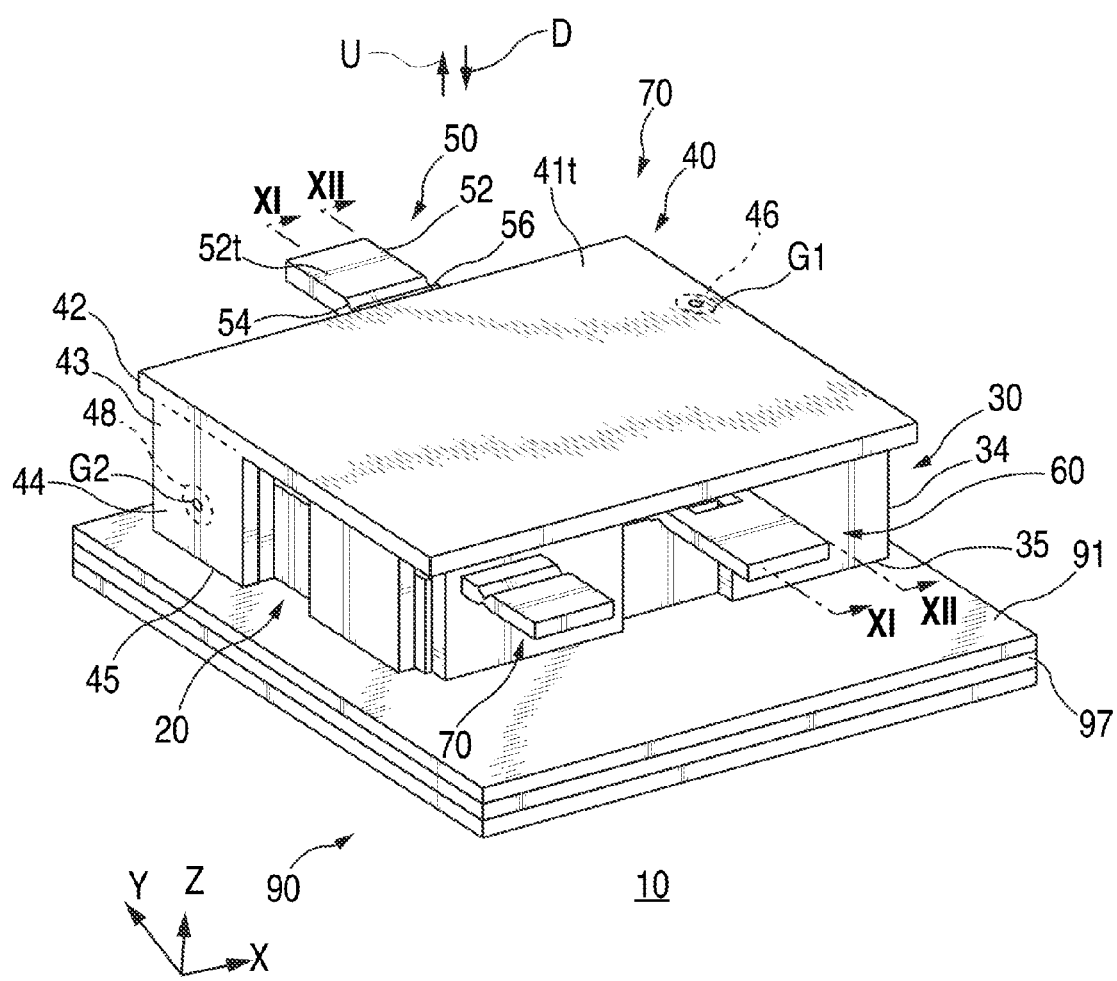
FIG. 10 is an isometric view, similar to FIGS. 1, 2, 5, and 8, of the portion of the electronic device and the shield assembly of FIGS. 1-9, in an alternative third stage of assemblage, in accordance with some embodiments of the invention.
Figure 11:
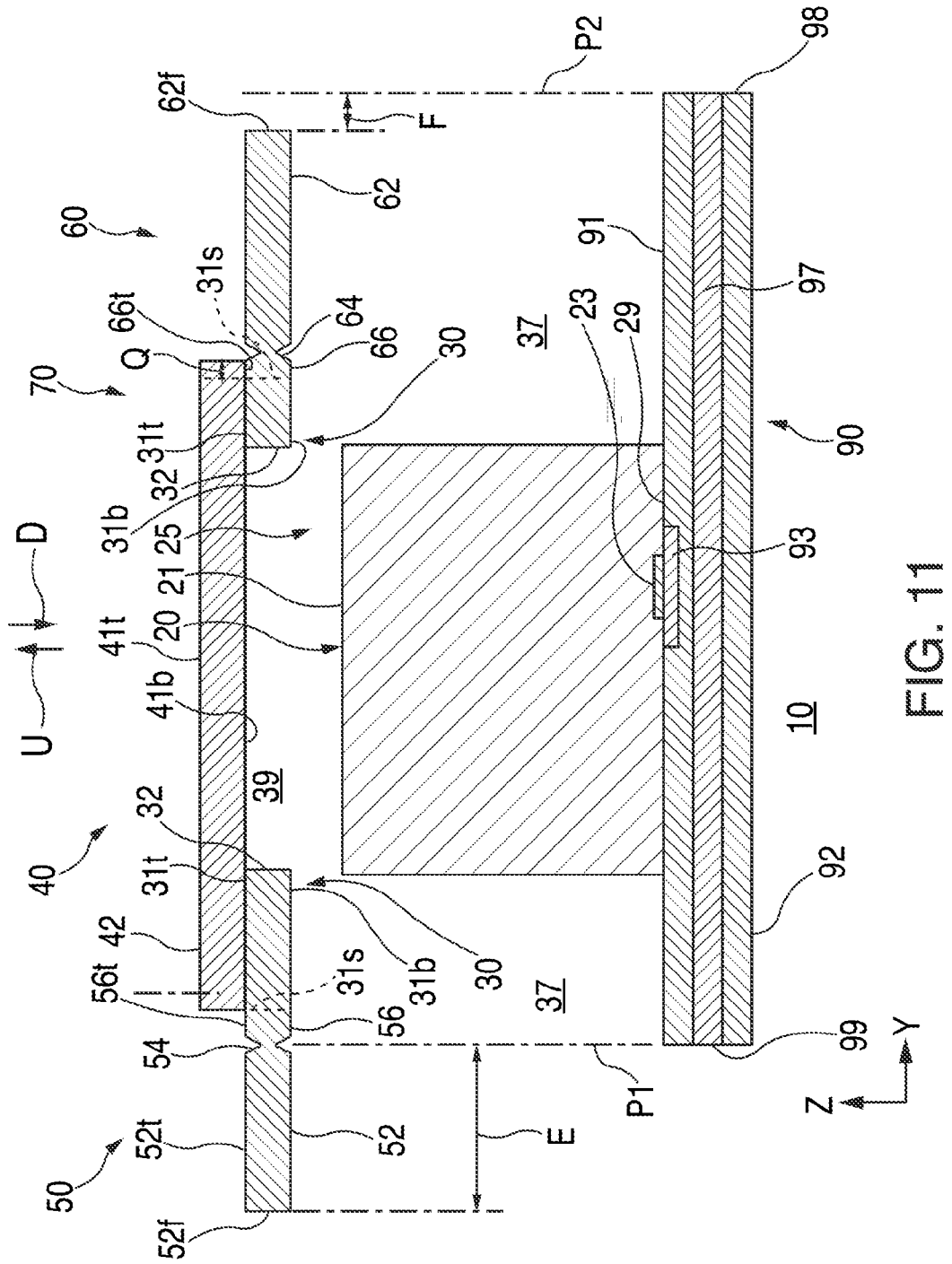
FIG. 11 is a partial cross-sectional view of the portion of the electronic device and the shield assembly of FIGS. 1-10, taken from line XI-XI of FIG. 10.
Figure 12:
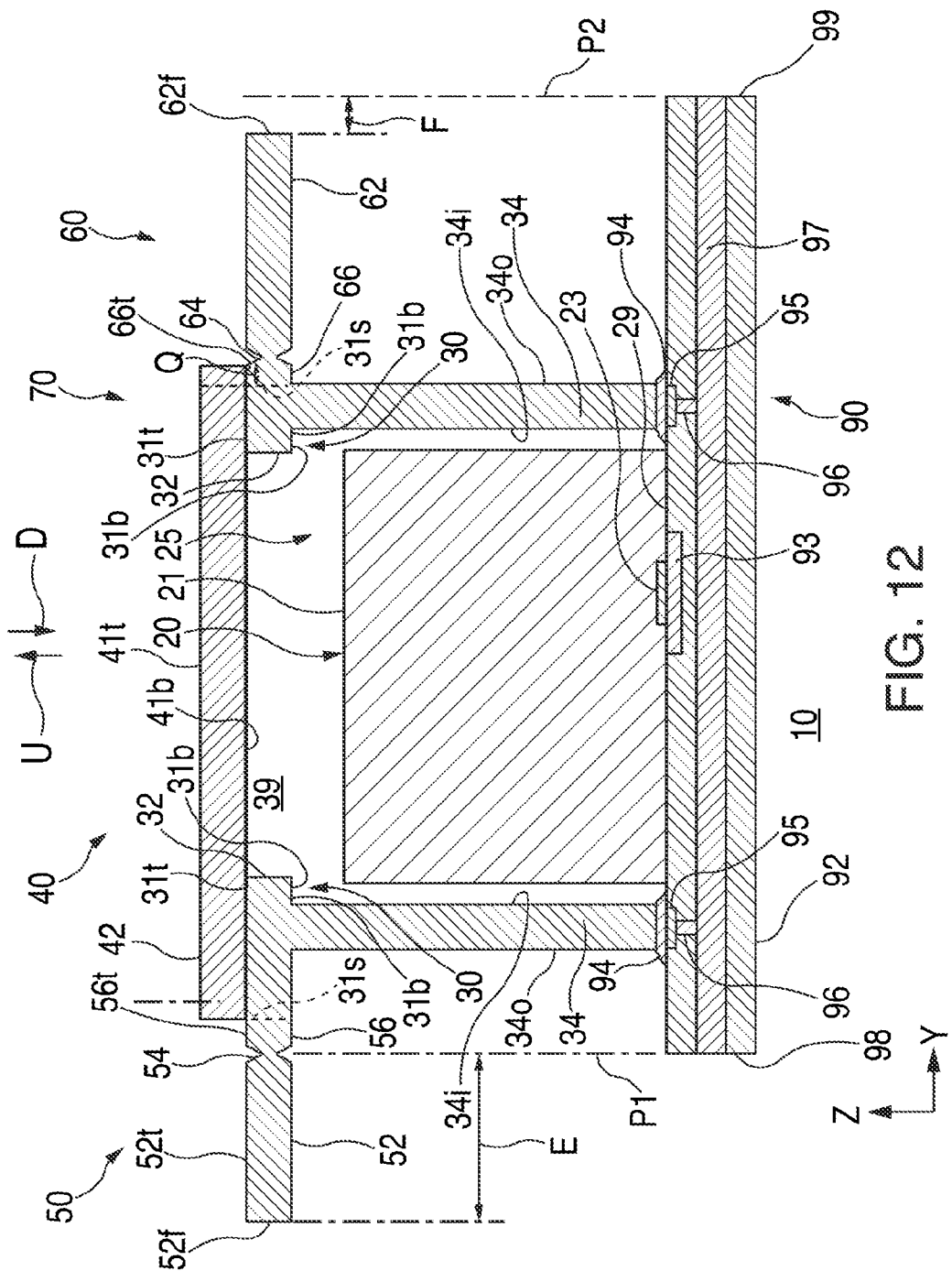
FIG. 12 is a partial cross-sectional view of the portion of the electronic device and the shield assembly of FIGS. 1-11, taken from line XII-XII of FIG. 10.

Although each tab of shield fence 30 (e.g., tab 52, tab 62, and/or tab 72) may be removed from shield fence 30 after shield fence 30 has been coupled to board 90 but before shield lid 40 has been coupled to shield fence 30 (e.g., as shown in FIGS. 1-9), in alternative embodiments, one or more tabs of shield fence 30 may be removed from shield fence 30 after circuit board 90 and shield lid 40 have each been coupled to shield fence 30. For example, as shown in FIGS. 10-12, each one of tabs 52, 62, and 72 may remain coupled to shield fence 30 until after shield lid 40 has been coupled to shield fence 30. In some embodiments, this may provide additional leverage for removing a tab from the remainder of shield fence 30. For example, as shown in FIGS. 11 and 12, a portion of lid 42 may extend over at least a portion of tab assembly 60 (e.g., over at least a portion of each tab extension 66). For example, bottom surface 41b of lid body 42 may extend a distance Q along top surface 66t of tab assembly 60. In some embodiments, lid body 42 may even be coupled (e.g., by solder) to tab assembly 60 along this distance Q. Such an extension of lid 40 along a portion of tab assembly may help provide additional leverage for the removal of tab 62 from the remainder of shield fence 30. Moreover, it may be easier to couple shield lid 40 to shield fence 30 when shield fence 30 is as rigid as possible. Therefore, if shield fence 30 is more rigid when a tab assembly (e.g., tab assembly 60) is coupled to shield fence 30 than when a tab assembly is no longer coupled to shield fence 30, it may be helpful to keep a tab assembly coupled to shield fence 30 until after shield lid 40 has been coupled to shield fence 30.

As shown in FIGS. 13-16, for example, another shield assembly 170 may be provided to shield other components of electronic device 10. Shield assembly 170 may include a shield fence 130 and a shield lid (not shown) that may be assembled with a portion of circuit board 90 for shielding a circuitry region 125, which may include electronic components 120a and 120b. Each one of electronic components 120a and 120b of circuitry region 125 may be mounted or otherwise coupled to top surface 91 of circuit board 90 similarly to electronic component 20 of circuitry region 25.

Although not shown, each one of electronic components 120a and 120b may include at least one terminal or bond pad or other component contact region that may be coupled to circuitry (not shown) of the electronic component and that may be electrically coupled to a respective terminal, bond pad, or other type of board contact region of circuit board 90 (e.g., as described above with respect to regions 23 and 93 of FIGS. 1-12). Such board contact regions of circuit board 90 may also be coupled to one or more signal planes, vias, or other circuitry (not shown) of circuit board 90 (e.g., a ground or common voltage plane 97 of circuit board 90, as described above with respect to assembly 70). Moreover, circuit board 90 may include one or more ground or common voltage contact regions (not shown) that may be provided on top surface 91 of circuit board 90 and/or that may be electrically coupled ground or common voltage plane 97 of circuit board 90 through a respective via.

FIGS. 13-16 illustrate shield assembly 170 in various stages of assemblage. When fully assembled, shield assembly 170 may protect circuitry region 125 of electronic device 10 from interference. Shield fence 130 may be substantially similar to shield fence 30 and may be provided about the periphery of circuitry region 125 and may be coupled to circuit board 90. Shield fence 130 may include one or more fence fingers 134 similar to fence fingers 34 that may extend from at least one fence body 132 about at least one opening 139 that may be similar to fence body 32 about opening 39. A shield lid (not shown) of shield assembly 170 may be substantially similar to shield lid 40 and may be coupled to shield fence 130.

For example, as shown in FIGS. 13-16, shield fence 130 may include a first tab assembly 150. Tab assembly 150 may be similar to tab assembly 50 and may include a tab 152 that may be releasably coupled to at least one tab extension 156 via at least one weakening feature 154. Each tab extension 156 may be fixedly coupled to shield fence 130. In some embodiments, as shown in FIGS. 13-16, a single tab extension 156 may extend at one end from an external side fence body surface 131s of fence body 132 (e.g., a portion of fence body 132 extending between top fence body surface 131t and bottom fence body surface 131b that is not exposed to opening 139), and tab 152 may extend from another end of tab extension 156. At least one weakening feature 154 may be provided between tab 152 and extension 156 that may promote the breaking away of tab 152 from extension 156. However, unlike shield fence 30, at least a portion of shield fence 130 may include a free-end portion 131f of fence body 132 that extends outwardly away from opening 139 (e.g., towards edge 98 of board 90), as opposed to a free-end portion 31f of fence body 32 that extends inwardly towards opening 139 (see, e.g., FIG. 3).

Figure 13:
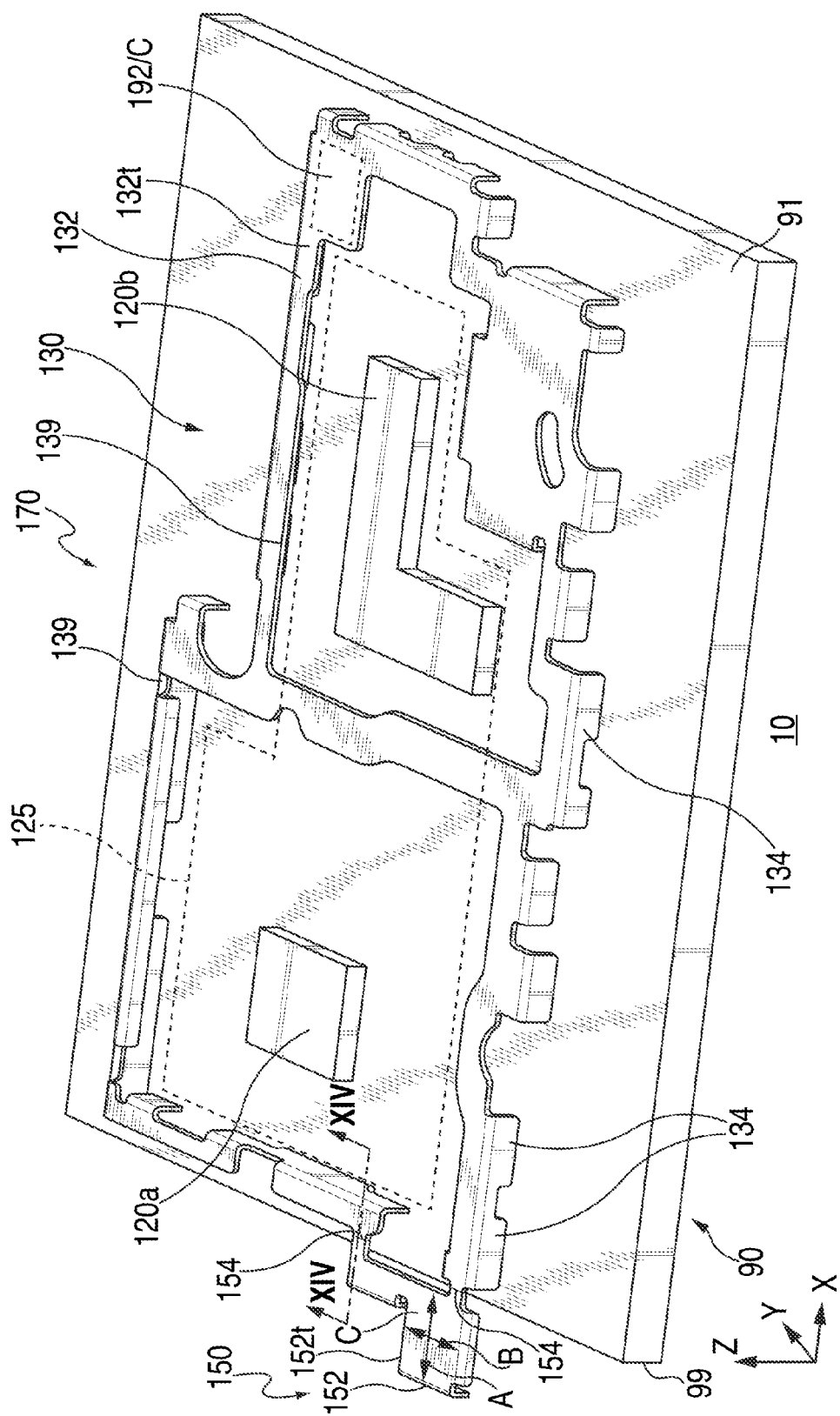
FIG. 13 is an isometric view of a shield fence coupled to a surface, in a first state of assemblage, in accordance with some embodiments of the invention.

As shown in FIG. 13, for example, a top surface 152t of tab 152 may have a length A and a width B that may define a surface area C. Length A and width B may be chosen to define a particularly sized and shaped surface area C that may be appropriate for use in manufacturing and/or handling shield fence 130. For example, length A and/or width B may be designed to be greater than a width W of fence body 132 such that top surface 152t of tab 152 may provide a larger surface area C than may be provided by an adjacent portion of top surface 131t of fence body 132. This geometry of tab assembly 150 may enable shield fence 130 to be held at surface area C by a tool that may not otherwise be able to successfully interact with shield fence 130 at a smaller surface area of fence body 132. For example, a vacuum head (not shown) that may be used during the manufacturing of shield fence 130 and/or during the positioning of shield fence 130 on circuit board 90 may require a surface area of at least 3.0 millimeters by at least 3.0 millimeters on a surface of shield fence 130 in order to successfully pick up shield fence 130. Thus, if the normal surface area defined by top surface 131t of fence body 132 (e.g., as defined by width W) is not large enough to interact with a certain tool, tab 152 of tab assembly 150 may be designed such that surface area C may be ample. For example, in some embodiments, length A may be in the range of 3.0 millimeters to 3.3 millimeters and width B may be in the range of 3.0 millimeters to 3.3 millimeters.

Weakening feature 154 of tab assembly 150 may be similar to weakening feature 54 and may be any suitable feature or combination of features suitable to provide at least one breaking point at which tab 152 may be releasable from extension 156 (e.g., after surface area C or any other geometry or property of tab 152 has been utilized). For example, weakening feature 154 may include one or more cuts or perforations into or through one or more surfaces of tab assembly 150, solder or welding that may temporarily hold tab 152 to extension 156, or combinations thereof.

In some embodiments, tab assembly 150 may be formed as an integral continuous portion of shield fence 130. For example, extension 156 and tab 152 may initially be a single continuous piece of material that may extend from a portion of fence body 132 (e.g., away from side surface 131s/free-end surface 131f). In some embodiments, tab assembly 150 may be formed in a single process with the formation of at least one other portion of shield fence 130. For example, tab 152, extension 156, and at least a portion of fence body 132 may be formed from a single piece of material (e.g., aluminum), and then feature 154 may be formed.

After the geometry or any other useful property of tab 152 has been utilized during the manufacturing and/or handling of shield fence 130 (e.g., after surface area C of tab 152 has been utilized by a vacuum head for properly positioning shield fence 130 about region 125 on circuit board 90), tab 152 may be broken away from each extension 156 and/or the remainder of shield fence 130 at each weakening feature 154.

Figure 14:
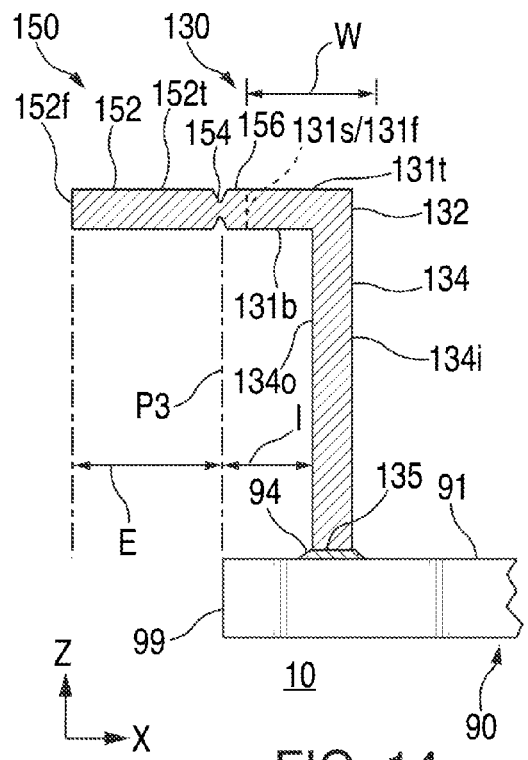
FIG. 14 is a partial cross-sectional view of the shield fence and the surface of FIG. 13, taken from line XIV-XIV of FIG. 13.
Figure 16:
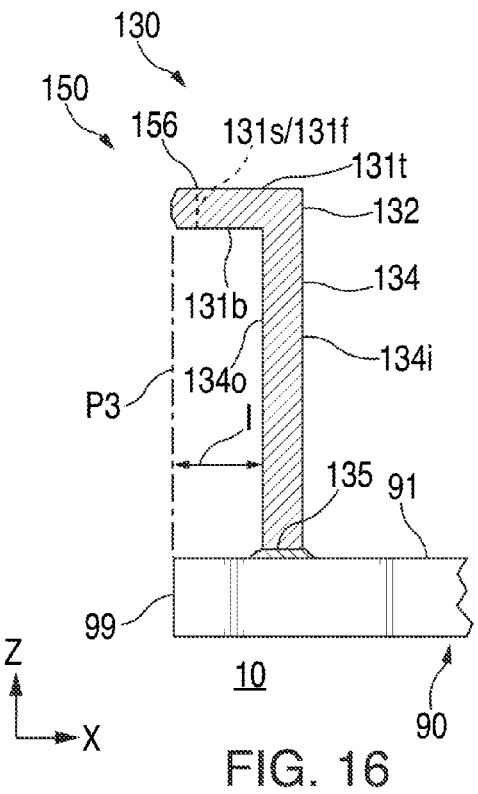
FIG. 16 is a partial cross-sectional view of the shield fence and the surface of FIGS. 13-15, taken from line XVI-XVI of FIG. 15.

In some embodiments, at least a portion of tab assembly 150 may extend over an edge of circuit board 90 such that there may be space adjacent to and/or below board 90 that may be used for leverage when removing tab 152 from the remainder of shield fence 130. For example, as shown in FIGS. 14 and 16, shield fence 130 may be coupled to circuit board 90 such that a side surface or edge 99 of circuit board 90, which may extend between top surface 91 and a bottom surface 92 of board 90, may be positioned directly underneath a portion of tab assembly 150. As shown, a plane P3 including edge 99 may intersect any suitable portion of tab assembly 150, such as weakening feature 154, such that a free-end 152f of tab 152 may extend beyond edge 99 of circuit board 90 by a distance E. Distance E may be any suitable distance that may allow a tool (e.g., tweezers) to properly grab and manipulate tab 152 without impediment from board 90, until feature 154 may release tab 152 from the remainder of shield fence 130. Moreover, because extension 156 may extend from a free-end 131f of fence body 132 extending outwardly away from opening 139 and at least one fence foot 134, plane P3 including edge 99 may extend beyond outer surface 134o of foot 134, and thus coupling 135 of foot 134 to board 90, by a distance I. Distance I may be any suitable distance that may allow a tool (e.g., tweezers) to properly grab and manipulate tab 152 without impediment from outer surface 134o of fence foot 134, until feature 154 may release tab 152 from the remainder of shield fence 130.

As shown in FIGS. 13 and 15, the width of fence body 132 may vary about opening 139 and, for example, a portion 192 of top surface 132t of fence body 132 may also have a length A and a width B that may define a surface area C. Like that of tab 152, length A and width B of fence body portion 192 may be chosen to define a particularly sized and shaped surface area C that may be appropriate for use in manufacturing and/or handling shield fence 130. This geometry of fence body portion 192 may enable shield fence 130 to be held at surface area C of fence body 132 by a tool that may not otherwise be able to successfully interact with shield fence 130 at a smaller surface area portion of fence body 132. For example, a first vacuum head (not shown) may interact with surface area C of tab 152 while a second vacuum head (not shown) may simultaneously interact with surface area C of fence body portion 192 during the manufacturing of shield fence 130 and/or during the positioning of shield fence 130 on circuit board 90. As shown, tab 152 and fence body portion 192 may be positioned on opposite sides of shield fence 130

(e.g., on opposite sides of opening 139), such that a single tool or two distinct tools may simultaneously or cooperatively interact with pad 152 and fence body portion 192 to evenly distribute or at least share the weight burden of shield fence 130.

The size and shape of each fence body, fence finger, fence opening, lid body, lid finger, interlocking feature, and contacting feature of assembly 70 and/or assembly 170 may vary based on various factors, such as the size and shape of the electronic components of the circuitry region being shielded, the magnitude of the interference to be shielded, and the like. For example, as shown in FIGS. 1-12, the shape of shield assembly 70 and circuitry region 25 above a portion of circuit board 90 may be substantially cuboidal, while shield assembly 170 and circuitry region 125 above another portion of circuit board 90 of FIGS. 13-16 may be irregular and specific to various geometric features of device 10.

Figure 17:
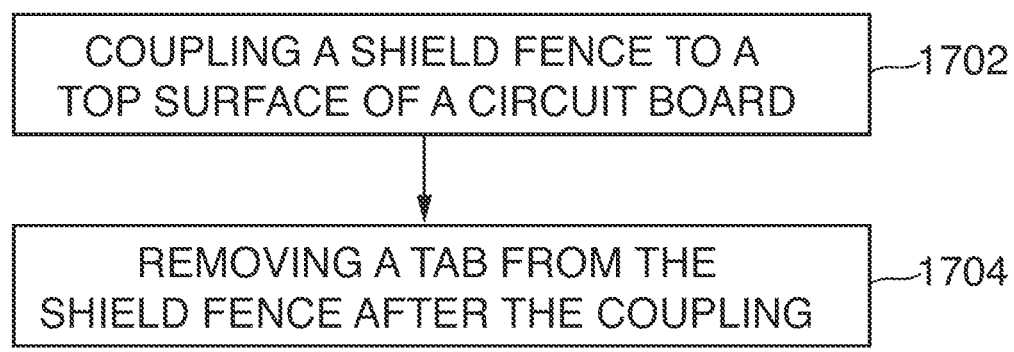
FIG. 17 is a flowchart of an illustrative process for shielding a circuitry region, in accordance with some embodiments of the invention.

FIG. 17 is a flowchart of an illustrative process 1700 for shielding a circuitry region. Process 1700 may include a first step 1702 for coupling a shield fence to a top surface of a circuit board. For example, as described, shield fence 30 may be coupled to top surface 91 of circuit board 90. Process 1700 may also include a step 1704 for removing a tab from the shield fence after the coupling of step 1702. For example, as described, tab 52 may be removed from shield fence 30 after shield fence 30 may be coupled to top surface 91 of circuit board 90. In some embodiments, process 1700 may also include coupling a shield lid to the shield fence before the removing of step 1704. In alternative embodiments, process 1700 may also include coupling a shield lid to the shield fence after the removing of step 1704. In some embodiments, the tab and the shield fence may together form a continuous loop and the removing of step 1704 may discontinue the continuous loop. For example, as described, removal of tab 62 from shield fence 30 may discontinue a continuous loop. In some embodiments, the coupling of step 1702 may provide leverage for the removing of step 1704. For example, as described, a portion of shield lid 40 may extend along a portion of tab assembly 60 when shield lid 40 is coupled to shield fence 30 for leveraging the removal of tab 62 of tab assembly 60 from shield fence 30.

It is understood that the steps shown in FIG. 17 are merely illustrative and that existing steps may be modified, added, or omitted.

While there have been described systems and methods for shielding circuitry from interference with a shield assembly having a removable tab, it is to be understood that many changes may be made therein without departing from the spirit and scope of the invention. It is also to be understood that various directional and orientational terms, such as "up" and "down," "left" and "right," "top" and "bottom," "X-," "Y-," and "Z-," and the like, are used herein only for convenience, and that no fixed or absolute directional or orientational limitations are intended by the use of these words. For example, the devices of the invention can have any desired orientation. If reoriented, different directional or orientational terms may need to be used in their description, but that will not alter their fundamental nature as within the scope and spirit of the invention. Those skilled in the art will appreciate that the invention can be practiced by other than the described embodiments, which are presented for purposes of illustration rather than of limitation, and the invention is limited only by the claims which follow.

What is claimed is:

1. A shield assembly comprising:
   a shield fence comprising:
   a fence body; and
   a plurality of fence fingers extending from the bottom of the fence body for coupling to a circuit board;
   a tab extending from the shield fence; and
   a shield lid for coupling to the top of the fence body, wherein the tab is configured to be removed from the shield fence after the shield fence is coupled to the circuit board.

2. The shield assembly of claim 1, wherein the tab is configured to be removed from the shield fence before the shield lid is coupled to the top of the fence body.

3. The shield assembly of claim 1, wherein the tab is configured to be removed from the shield fence after the shield lid is coupled to the top of the fence body.

4. The shield assembly of claim 3, wherein a portion of the shield lid extends along a portion of the tab to provide leverage for the removal of the tab from the shield fence.

5. The shield assembly of claim 1, further comprising a feature between the tab and the shield fence, wherein the feature promotes the removal of the tab from the shield fence.

6. The shield assembly of claim 5, wherein the feature comprises at least one of a cut into the tab, a perforation through the tab, a half shear into the tab, and solder between the tab and the shield fence.

7. The shield assembly of claim 1, wherein the tab extends from the fence body.

8. The shield assembly of claim 1, wherein the tab extends from a side of the fence body, wherein the side of the fence body extends from the top of the fence body to the bottom of the fence body.

9. The shield assembly of claim 1, wherein the tab extends from a portion of the fence body that is above a first fence finger of the plurality of fence fingers.

10. The shield assembly of claim 1, wherein the tab extends from a portion of the fence body that is not above any fence finger of the plurality of fence fingers.

11. The shield assembly of claim 1, wherein the tab and the shield fence are a single integrated component.

12. The shield assembly of claim 1, wherein the tab extends from a first fence finger of the plurality of fence fingers.

13. The shield assembly of claim 1, wherein the tab and the shield fence together form a continuous loop, and wherein the removal of the tab from the shield fence discontinues the continuous loop.

14. The shield assembly of claim 1, wherein the shape of the top of the tab is greater than the shape of any portion of the top of the fence body.

15. The shield assembly of claim 14, wherein the shape of the top of the tab is configured to be held by a tool, and wherein the shape of any portion of the top of the fence body is not configured to be held by the tool.

16. The shield assembly of claim 1, wherein at least one of the shield fence and the shield lid reduces electromagnetic interference.

17. An electronic device comprising:
   a circuit board comprising:
   a top surface;
   a bottom surface; and
   a side surface that extends from the top surface to the bottom surface;
   a shield assembly for coupling to the top surface of the circuit board; and
   a tab extending from the shield assembly, wherein the tab is configured to be removed from the shield assembly after the shield assembly is coupled to the top surface of the circuit board.

18. The electronic device of claim 17, wherein the side surface of the circuit board resides in a first plane, and wherein at least a portion of the tab extends through the first plane when the shield assembly is coupled to the top surface of the circuit board and when the tab extends from the shield assembly.

19. The electronic device of claim 17, wherein the side surface of the circuit board resides in a first plane, wherein a free end of the tab extends a first distance beyond the first plane when the shield assembly is coupled to the top surface of the circuit board, and wherein the first distance provides leverage for the removal of the tab from the shield assembly.

20. The electronic device of claim 17, further comprising an electronic component coupled to the top surface of the circuit board, and wherein the shield assembly protects the electronic component from electromagnetic interference when the shield assembly is coupled to the top surface of the circuit board.

21. A method comprising:
coupling a shield fence to a top surface of a circuit board; and
removing a tab from the shield fence after the coupling.

22. The method of claim 21, further comprising coupling a shield lid to the shield fence before the removing.

23. The method of claim 21, further comprising coupling a shield lid to the shield fence after the removing.

24. The method of claim 21, wherein:
the tab and the shield fence together form a continuous loop; and
the removing comprises discontinuing the continuous loop.

25. The method of claim 21, wherein the coupling provides leverage for the removing.

\* \* \* \* \*